United States Patent
Parikh

(10) Patent No.: US 11,557,509 B1
(45) Date of Patent: Jan. 17, 2023

(54) SELF-ALIGNMENT ETCHING OF INTERCONNECT LAYERS

(71) Applicant: Applied Materials, Inc., Santa Clara, CA (US)

(72) Inventor: Suketu Arun Parikh, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 16/691,453

(22) Filed: Nov. 21, 2019

Related U.S. Application Data

(60) Provisional application No. 62/784,263, filed on Dec. 21, 2018.

(51) Int. Cl.
*H01L 21/768* (2006.01)
*H01L 21/3213* (2006.01)

(52) U.S. Cl.
CPC .... *H01L 21/7682* (2013.01); *H01L 21/32139* (2013.01); *H01L 21/76819* (2013.01); *H01L 21/76837* (2013.01); *H01L 21/76892* (2013.01)

(58) Field of Classification Search
None
See application file for complete search history.

(56) References Cited

U.S. PATENT DOCUMENTS

| | | | |
|---|---|---|---|
| 5,532,516 A | 7/1996 | Pasch et al. | |
| 5,654,216 A * | 8/1997 | Adrian | H01L 21/32136 257/E21.311 |
| 6,127,263 A | 10/2000 | Parikh | |
| 6,225,207 B1 | 5/2001 | Parikh | |
| 6,352,917 B1 * | 3/2002 | Gupta | H01L 21/76831 438/622 |
| 6,541,397 B1 | 4/2003 | Bencher | |
| 6,594,540 B1 | 7/2003 | Parikh | |
| 7,902,661 B2 * | 3/2011 | Smeys | H01L 21/4853 257/698 |
| 9,412,581 B2 | 8/2016 | Thadani et al. | |
| 9,646,876 B2 | 5/2017 | Padhi et al. | |
| 9,653,320 B2 | 5/2017 | Agarwal et al. | |
| 9,865,459 B2 | 1/2018 | Cheng et al. | |
| 9,960,045 B1 | 5/2018 | Purayath et al. | |
| 10,629,484 B1 * | 4/2020 | Parikh | H01L 21/0217 |
| 2002/0074313 A1 * | 6/2002 | Hu | H01L 21/32139 216/41 |
| 2003/0183940 A1 * | 10/2003 | Noguchi | H01L 21/76801 257/767 |

(Continued)

OTHER PUBLICATIONS

Moroz et al., "Can We Ever Get to a 100 nm Tall Library? Power Rail Design for 1nm Technology Node", Synopsys, Inc., Mountain View, CA, USA, Synopsys, Gladgow, UK, Applied Materials Santa Clara CA USA.

*Primary Examiner* — Allan W. Olsen
(74) *Attorney, Agent, or Firm* — Patterson & Sheridan, LLP

(57) ABSTRACT

A method for etching a metal containing feature is provided. Using a pattern mask, layers of material are etched to expose a portion of a metal containing feature. At least a portion of the exposed metal containing feature is etched, and is replaced by the growth of a filler dielectric. The etched portion of the metal containing feature and the filler dielectric reduce the unwanted conductivity between adjacent metal containing features.

20 Claims, 21 Drawing Sheets

(56) References Cited

U.S. PATENT DOCUMENTS

| | | | |
|---|---|---|---|
| 2003/0201121 A1* | 10/2003 | Jeng | H01L 21/76885 |
| | | | 174/256 |
| 2009/0267166 A1* | 10/2009 | Verheijden | H01L 21/7682 |
| | | | 257/415 |
| 2012/0032344 A1* | 2/2012 | Usami | H01L 21/76807 |
| | | | 257/774 |
| 2016/0293609 A1 | 10/2016 | Jha et al. | |
| 2017/0372960 A1 | 12/2017 | Mebarki et al. | |
| 2018/0145035 A1* | 5/2018 | Singh | H01L 23/49827 |
| 2019/0035677 A1* | 1/2019 | Chandhok | H01L 21/76865 |
| 2019/0371657 A1* | 12/2019 | Chandhok | H01L 23/5226 |

* cited by examiner

SELF-ALIGNMENT ETCHING OF INTERCONNECT LAYERS

CROSS-REFERENCE TO RELATED APPLICATIONS

This application claims priority to U.S. Provisional Patent Application No. 62/784,263, filed Dec. 21, 2018, which is hereby incorporated by reference in its entirety.

BACKGROUND

Field

Embodiments of the invention relate to a method and, more specifically, to self-alignment etching of interconnect layers.

Description of the Related Art

Semiconductor devices such as an IC (integrated circuit) generally have electronic circuit elements, such as transistors, diodes and resistors fabricated integrally on a single body of semiconductor material. The various circuit elements are connected through conductive connectors to form a complete circuit, which can contain millions of individual circuit elements. Advances in semiconductor materials and processing techniques have resulted in reducing the overall size of the IC while increasing the number of circuit elements. Additional miniaturization is highly desirable for improved IC performance and cost reduction. Interconnects provide the electrical connections between the various electronic elements of an IC, and they form the connections between these elements and the device's external contact elements, such as pins, for connecting the IC to other circuits. Typically, interconnect lines form the horizontal connections between the electronic circuit elements, while conductive via plugs form the vertical connections between the electronic circuit elements, resulting in layered connections.

A variety of techniques are employed to create interconnect lines and vias. One such technique involves a process generally referred to as dual damascene, which includes forming a trench and an underlying via hole. The trench and the via hole are simultaneously filled with a conductor material, for example a metal, thus simultaneously forming an interconnect line and an underlying via plug.

As the size of devices and their features shrink, the precision placement and size of the deposited vias and other metal containing features becomes increasingly important. Current damascene procedures for creating interconnects involves multiple etch and metal deposition operations for metal containing features. As current technology moves toward 7 nm nodes, 5 nm nodes, and beyond, the margin of error for placement of metal containing features shrinks correspondingly. Incorrectly aligned or placed metal containing features can lead to unwanted horizontal conduction between adjacent metal containing features, leading to short circuits, which ruin the functionality of the transistor or device. Incorrect alignment can be caused through operator error, equipment malfunction, or general uncertainty due to the nanoscale level precision required for correct placement. One drawback of the current art in metal containing feature deposition is the inability to easily align metal containing features in an interconnect stack. In many cases, errors in alignment are not discovered until multiple layers of growth have been performed on top of the incorrectly placed vias, causing the vias to be buried and not easily accessible. In addition, defective interconnect stacks often cause device yield problems which require the defective ICs to be destroyed, leading to increased cost to the manufacturer.

Therefore, there is a need for a method of self-alignment of already placed metal containing features, even when the metal containing features are buried under growth layers.

SUMMARY

In one embodiment, a method of etching a metal containing feature is provided, including forming openings in a patterned mask disposed over a plurality of interconnect layers, selectively etching a portion of the plurality of interconnect layers through the openings formed in the patterned mask, wherein a portion of a metal containing feature disposed below the patterned mask is exposed, selectively etching the portion of the metal containing feature, creating an etched portion of the metal containing feature, selectively removing the patterned mask, and depositing a dielectric material within the selectively etched portion of the interconnect layers and on the etched portion of the metal containing feature. The plurality of interconnect layers is disposed over a substrate.

In another embodiment, a method of etching a metal containing feature is provided, including forming openings in a patterned mask disposed over a plurality of interconnect layers, such that at least a portion of a metal containing feature disposed in the plurality of interconnect layers is under the openings of the patterned mask, the plurality of interconnect layers are disposed over a surface of a substrate, selectively etching a portion of the plurality of interconnect layers through the openings formed in the patterned mask to form a channel, wherein a portion of the substrate is exposed within the formed channel, depositing a dielectric material in the channel, and selectively removing the patterned mask.

Layers between the surface of the device and the metal containing feature are selectively etched so that a portion of the metal containing feature is exposed. The exposed portion of the metal containing feature is partially or completely etched, depending on the extent of the misalignment of the metal containing feature. In the void or channel created by the etch, a dielectric is deposited, which electrically isolates the metal containing feature from adjacent metal containing features. This allows the fixing of the misaligned metal containing features, without having to grow a new set interconnect stack from scratch. In addition, the method allows the self-aligning of metal contained features that are buried under further layers of growth. Portions of the dielectric in the device have air gaps, which are formed during deposition of the dielectric.

BRIEF DESCRIPTION OF THE DRAWINGS

So that the manner in which the above-recited features of the present disclosure can be understood in detail, a more particular description of the embodiments, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the disclosure provided herein include a process of aligning metal containing features in a layered structure in order to simplify the alignment of metal layers and prevent unwanted or unreliable electrical connections to be formed between layers and/or improve isolation between misaligned interconnects. In some embodiments, the process includes selectively etching a portion of a metal containing feature to form reliable and electrically isolated electrical interconnects formed between different metal layers that are not perfectly aligned. In some embodiments, the metal containing feature is only partially etched, such that the etch stops before reaching the bottom of the metal containing feature. In some embodiments, the process includes selectively etching a portion of a metal containing feature to electrically isolate the metal containing feature from one or more neighboring metal containing features. In some embodiments, the metal containing feature is completely etched, such that the etch reaches the bottom of the metal containing feature. In some embodiments, the portion of the metal containing feature that has been etched is filled by a dielectric filler. The etching of the metal containing feature, and subsequent replacement by a dielectric filler, reduces electrical coupling and/or current leakage between neighboring metal containing features. In some of these embodiments, layers of the interconnect stack comprises an air gap. Embodiments of the disclosure provided herein may be especially useful for, but are not limited to, improving the electrical isolation of metal containing features when they are misaligned within a device.

Figure 1A:
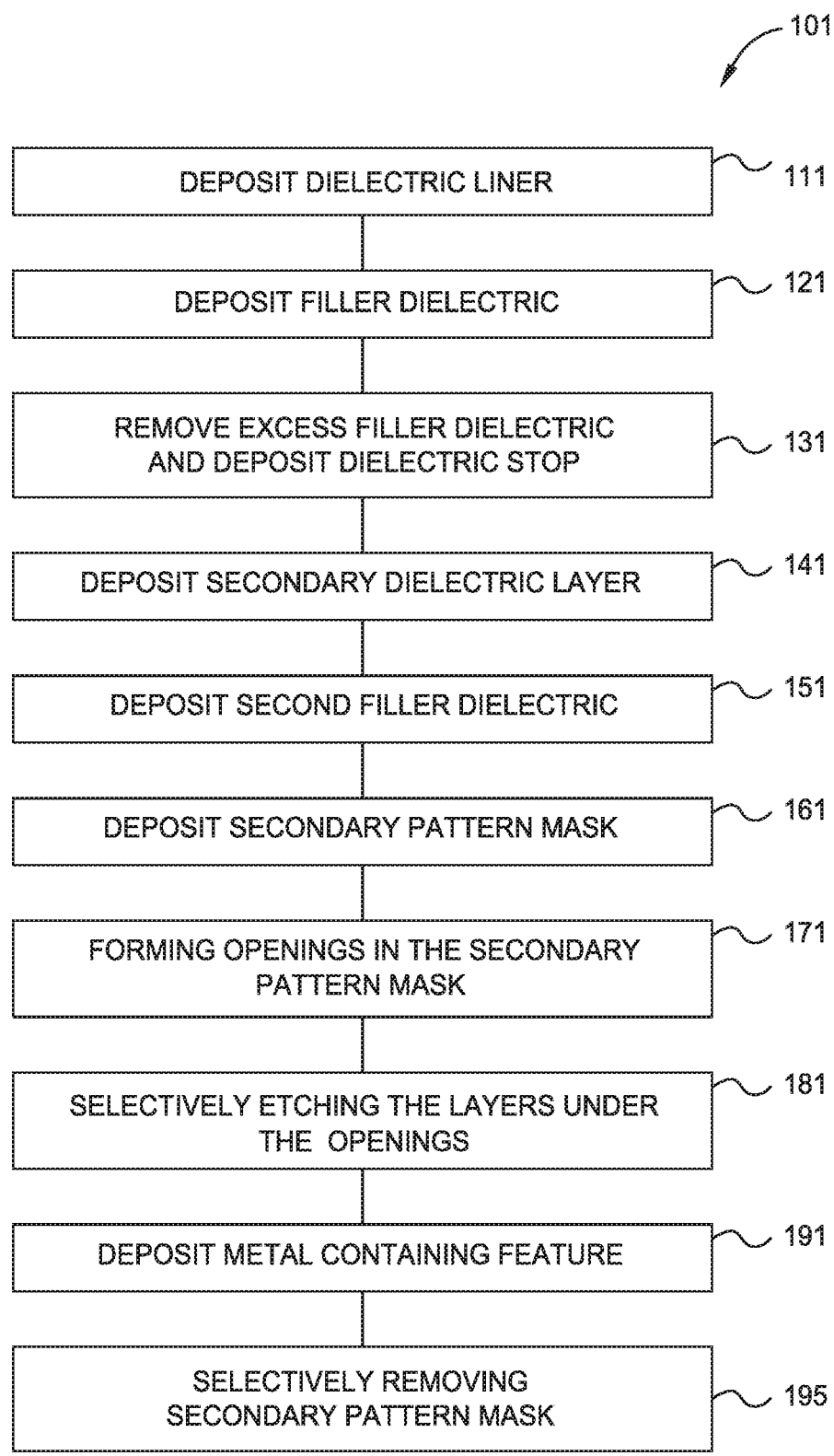
FIG. 1A is a flow chart of method operations for depositing aligned metal containing features, according to one embodiment.
Figure 1B:
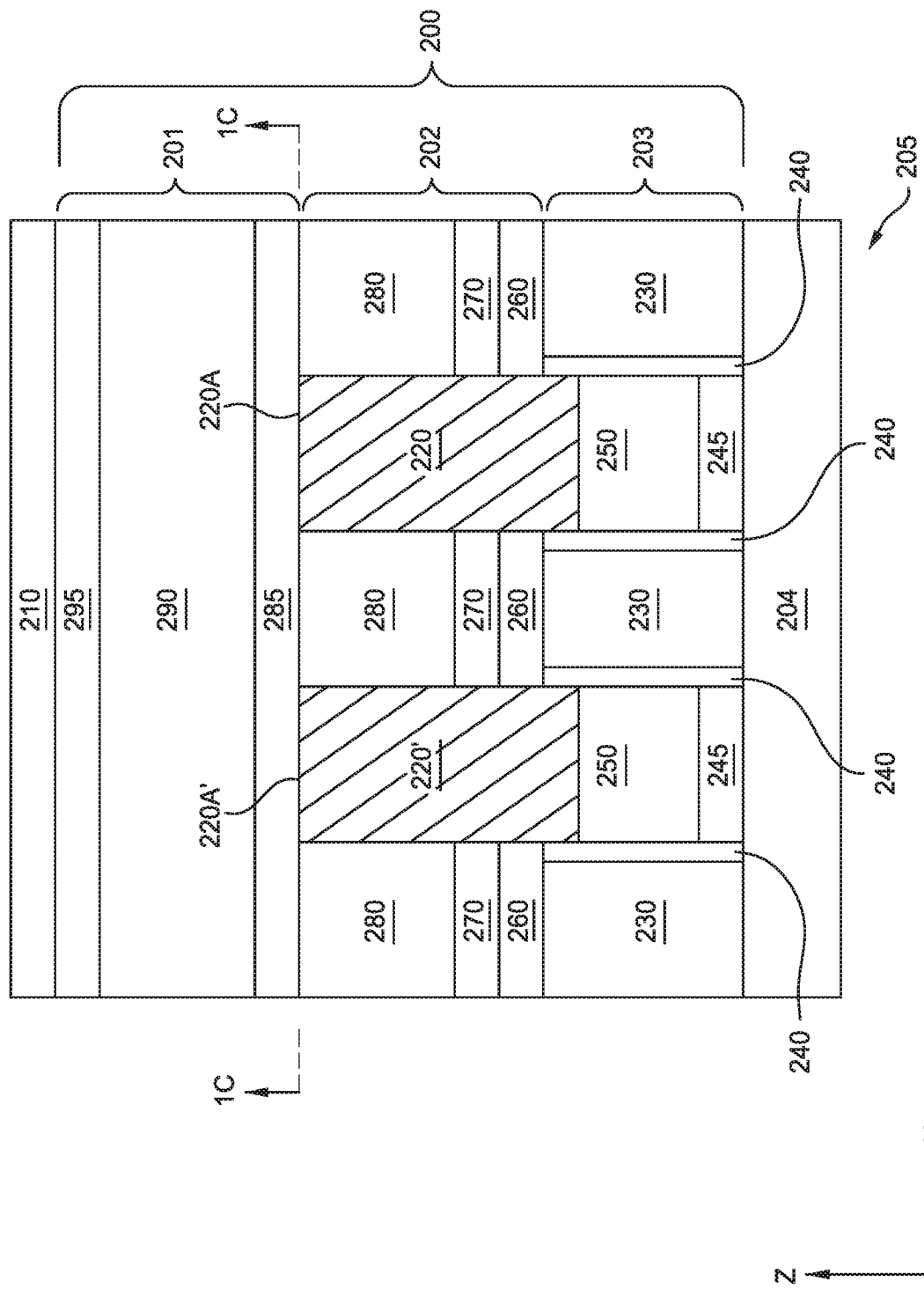
FIG. 1B illustrates a schematic side view of an interconnect stack, according to one embodiment.

FIG. 1A is a flow chart of method operations for deposition of aligned metal containing features, according to one embodiment. FIG. 1B illustrates a schematic side view of a portion of an interconnect stack 205, according to one embodiment, which illustrates the structure described by the method of FIG. 1A. As shown, the interconnect stack 205 comprises a pattern mask 210, a plurality of interconnect layers 200, and a substrate 204. The pattern mask 210 is disposed over the plurality of interconnect layers 200. The pattern mask 210 allows the selective etching or deposition of material on the underlying plurality of interconnect layers 200, as the pattern mask protects certain regions from unwanted etching is subsequent processes. In one embodiment, the pattern mask 210 includes a photoresist material. In another embodiment, the pattern mask 210 comprises a deposited layer of self-assembled monolayers (SAMs). The pattern mask 210 can include carbon (C), such as amorphous carbon.

The plurality of interconnect layers 200 is disposed over a substrate 204. The substrate 204 supports the plurality of interconnect layers 200. In some embodiments, the substrate 204 is semiconducting. In some embodiments, the substrate 204 is a flat, featureless silicon wafer. In other embodiments, the substrate 204 is a patterned silicon wafer as is typically used in logic gates, I/O gates, field effect transistors, fin field effect transistors (finFETs), or memory applications. Substrate 204 may include a material such as crystalline silicon (e.g., Si<100> or Si<111>), silicon oxide, strained silicon, silicon germanium, doped or undoped polysilicon, doped or undoped silicon, patterned or non-patterned wafer, silicon on insulator (SOI), carbon-doped silicon oxides, silicon nitride, doped silicon, germanium, gallium arsenide, glass, sapphire, metal layers disposed on silicon, and the like. Substrate 204 may be configured as a 200 mm, 300 mm, or 450 mm diameter wafer, or as a rectangular or square panel. In one embodiment, the substrate 204 contains alignment marks (not shown) or other features on a surface of the substrate 204 to help align and position a desired pattern within the pattern mask 210, to ensure that the correct layer pattern is grown or etched. The components of the interconnect stack 205 work in concert to provide an initial interconnect to perform the self-alignment.

In some embodiments, the initially formed interconnect layers 200 are used to form a self-aligned structure by etching one or more of the underlying layers and then the deposition of one or more dielectric or metal layers. In some embodiments, the plurality of interconnect layers 200 further comprises a first plurality of interconnect layers 202, a second plurality of interconnect layers 201, and a third plurality of interconnect layers 203. The second plurality of interconnect layers 201 is disposed under the pattern mask 210, and over the first plurality of interconnect layers 202. The first plurality of interconnect layers 202 is disposed under the second plurality of interconnect layers 201, and over the third plurality of interconnect layers 203. The components of the plurality of interconnect layers 200 work in concert to provide the interconnect stack 205 with all the necessary material layers to perform as an interconnect structure that is used to interconnect the various devices formed on the substrate 204.

In some embodiments, the third plurality of interconnect layers 203 further comprises a metal liner 245, a stack metal 250, a dielectric liner 240, and a filler dielectric 230. The materials used to form parts of the interconnect layers can be deposited via physical vapor deposition (PVD), chemical vapor deposition (CVD), atomic layer deposition (ALD), or other similar process. Use of deposition techniques, such as ALD, alloys layer-by-layer control of the growth of any of the interconnect layers. Metal liner 245 is disposed over the substrate 204 and patterned to form discrete regions. In some embodiments, the metal liner 245 includes titanium (Ti), iridium (Ir), platinum (Pt), or an alloy of the above. The stack metal 250 is disposed over the metal liner 245. The metal liner 245 improves the adhesion of the stack metal 250, and reduces grain size of the stack metal. In some embodiments, the stack metal 250 includes a refractory metal, such as molybdenum (Mo), ruthenium (Ru), tungsten (W), cobalt (Co), nickel (Ni), copper (Cu), aluminum (Al), rhodium (Rh), iridium (Ir), nickel silicide (NiSi), or some combination of the above.

The dielectric liner 240 lines the sides of the metal liner 245 and the stack metal 250. In some embodiments, the dielectric liner 240 includes a material such as silicon carbonitride, silicon nitride, or aluminum oxide. The dielectric liner 240 may help to prevent the unwanted migration of metal atoms from the stack metal 250 from migrating into the filler dielectric 230, and causing undesired short circuits between adjacent stack metals. The space bounded by the dielectric liner 240, substrate 204, and first plurality of interconnect layers 202 is filled with a filler dielectric 230. In some embodiments, the filler dielectric 230 can be a low k-dielectric. The filler dielectric 230 is a silicon dioxide, silicon nitride, or silicon carboxide, according to one embodiment. The filler dielectric 230 has a dielectric constant of about 2.7, according to one embodiment. The filler dielectric 230 can in some case include a flowable dielectric material, according to one embodiment. The components of the third plurality of interconnect layers 203 work in concert to provide the plurality of interconnect layers 200 with all the necessary material layers to perform as a base for the metal containing feature 220, and electrically isolate the stack metal 250 from the substrate 204.

In some embodiments, the filler dielectric 230 does not completely fill the space bounded by the dielectric liner 240, substrate 204, and first plurality of interconnect layers 202. Instead, an air gap is left in the center portion of the filler dielectric 230. It is noted that the term "air gap" may also refer any other gas-filled gap and/or to a vacuum containing gap. The air gap reduces the capacitance of the filler dielectric 230 created between adjacently positioned metal interconnects. The lowered capacitance reduces resistive-capacitive (RC) delay and power consumption of the interconnect, and helps prevent unwanted crosstalk between neighboring stack metal 250.

In one embodiment, the substrate 204 is a flat silicon wafer, the metal liner 245 is titanium (Ti) that has a thickness of about 15 Å, the stack metal 250 is tungsten (W) that has a thickness of about 300 Å, the dielectric liner 240 is aluminum oxide that has a thickness of about 10-15 Å, and the filler dielectric 230 is silicon dioxide that has a thickness of about 100 Å.

In some embodiments, the first plurality of interconnect layers 202 further includes a dielectric stop 260, a secondary dielectric layer 270, a second filler dielectric 280, and a metal containing feature 220. The materials used to form the interconnect layers can be deposited via physical vapor deposition (PVD), chemical vapor deposition (CVD), atomic layer deposition (ALD), and or other similar process. The dielectric stop 260 is disposed over the filler dielectric 230 and the dielectric liner 240. In some embodiments, the dielectric stop 260 includes silicon dioxide, silicon nitride, silicon carbonitride, or silicon carboxide. The secondary dielectric layer 270 is disposed over the dielectric stop 260. The second filler dielectric 280 is disposed over the secondary dielectric layer 270. The second filler dielectric 280 includes silicon dioxide, silicon nitride, silicon carbonitride, or silicon carboxide, according to one embodiment. The metal containing feature 220 is disposed over the stack metal 250, and is sandwiched between two adjacent stacks of the second filler dielectric 280, secondary dielectric layer 270, and dielectric stop 260. In some embodiments, the metal containing feature 220 is a via, plug, component of a transistor, or other conductive semiconductor device feature. In some embodiments, there is no second filler dielectric 280, and instead the metal containing feature 220 height matches that of the secondary dielectric layer 270.

In one embodiment, the dielectric stop 260 is silicon carbonitride at a thickness of about 30 Å, the secondary dielectric layer 270 is aluminum oxide that has a thickness of about 10-15 Å, the second filler dielectric 280 is silicon dioxide that has a thickness of about 100 Å, and the metal containing feature 220 is W that has a thickness of about 300 Å.

In general, the metal containing features 220 are intended to be lined up with the device formed on the substrate 204 in a pattern of metal containing features that have a specific width, and horizontal placement (perpendicular direction to the substrate). However, the metal containing features 220 can either be misplaced with respect to their desired position over the substrate 204, or the metal containing features can be grown with too large of a width due to lithography errors. The cause of these unwanted positions or width of the metal containing features 220 can be due to variation in alignment of the to be formed patterns to alignment marks, operator error, equipment malfunction, or general uncertainty due to the nanoscale level precision required for correct placement. In any case, it is not uncommon in the art for two adjacent metal containing features 220, 220' to be too close to one another in the horizontal direction. If this occurs, an unwanted short circuit can be formed horizontally, or more commonly an undesirably high capacitance is formed between the adjacent features which affect the RC constant of the formed device, which will cause a malfunction in the performance of the formed IC device. This unwanted short circuit can be remedied by the operations for self-alignment of a metal containing feature, as recited in the method operations below.

In some embodiments, the second plurality of interconnect layers 201 further include a second metal liner 285, a second stack metal 290, and a surface metal layer 295. The materials in the interconnect layers can be deposited via physical vapor deposition (PVD), chemical vapor deposition (CVD), atomic layer deposition (ALD), or other similar process. The second metal liner 285 is disposed over the metal containing feature 220, and below the second stack metal 290. In some embodiments, the second metal liner 285 includes Ti, Ir, Pt, an alloy thereof, nitride thereof, or other desirable metal containing etch stop layer. The second stack metal 290 is disposed over the second metal liner 285. The second metal liner 285 improves the adhesion of the second stack metal 290, and reduces grain size of the second stack metal. In some embodiments, the second stack metal 290 includes a refractory metal, such as Mo, Ru, W, Co, Ni, Cu, Al, Rh, Ir, nickel silicide, or some combination of the above. The surface metal layer 295 is disposed over the second stack metal 290, and below the pattern mask 210. In some embodiments, a portion of the second metal liner 285, the second stack metal 290, and the surface metal layer 295 are etched through patterned openings 299 (FIG. 2C) formed in the pattern mask during method 100 (FIG. 1). The components of the second plurality of interconnect layers 201 work in concert to provide the plurality of interconnect layers 200 with all the necessary material layers to perform as surrounding structure for the metal containing feature 220 necessary for proper functioning of the device, along with supporting the pattern mask 210.

Figure 1C:
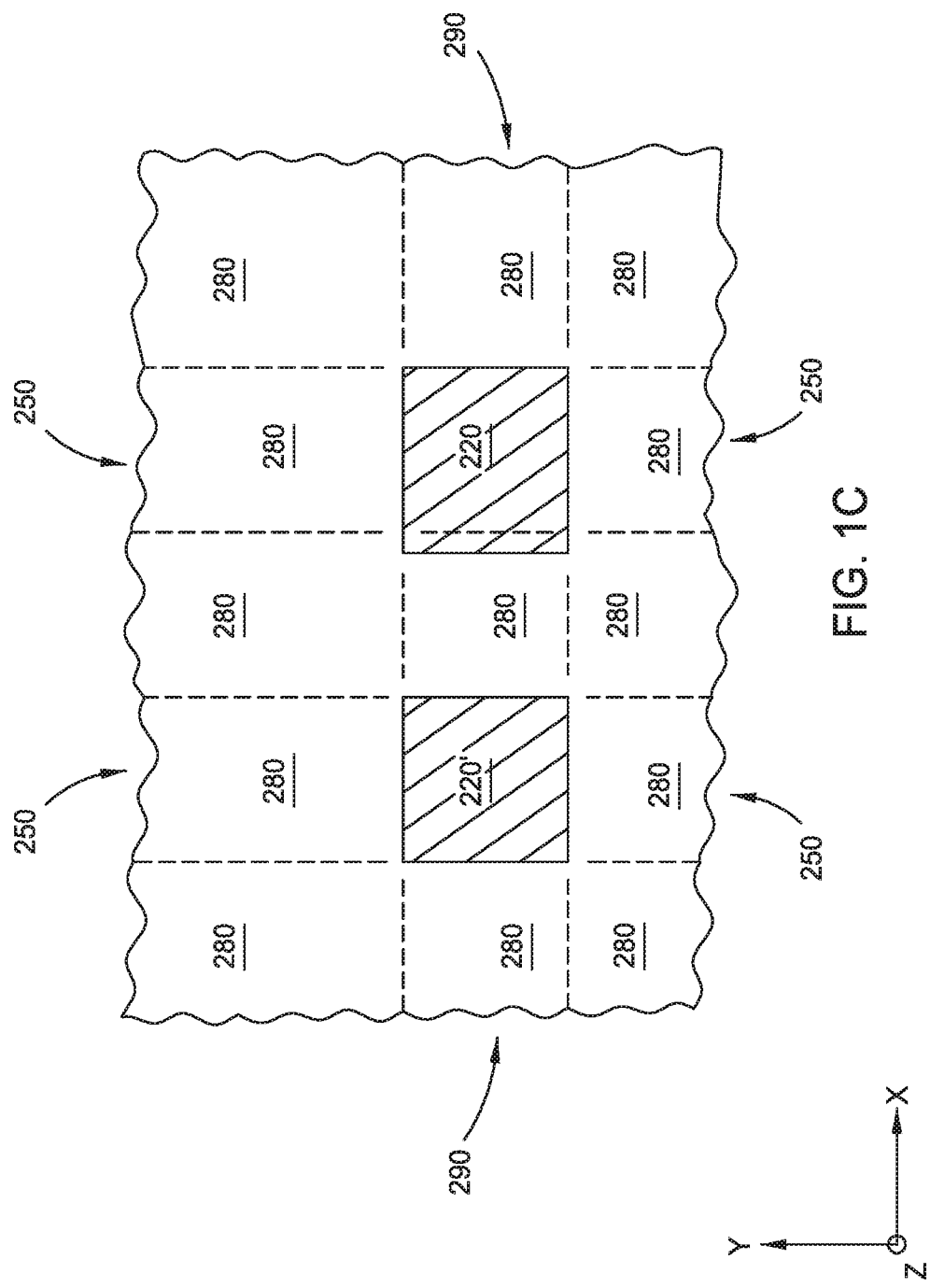
FIG. 1C illustrates a top view of a portion of the interconnect stack of FIG. 1B that is viewed from the sectioning line 1C-1C shown in FIG. 1B, according to one embodiment.

FIG. 1C illustrates a top view of the interconnect stack of FIG. 1B, according to one embodiment. As shown in FIG. 1C, a portion of the metal containing feature 220 is misaligned with the underlying stack metal 250 (i.e., illustrated by the vertically oriented dashed lines), and misaligned with the overlying second stack metal 290 (i.e., illustrated by the horizontally oriented dashed lines). In FIG. 1C, the misalignment is due to the metal containing feature 220 having a width that is too large in the X-direction at the intersection of the stack metal 250 and the second stack metal 290. In some cases, the metal containing feature 220 has the desired width, but is grown such that it does not line up correctly with the stack metal 250, the second stack metal 290, or both, according to one embodiment. However, the metal containing feature 220 can be formed with an incorrect width in any direction, and/or the metal containing feature 220 can be positioned so that it does not line up correctly with the stack metal 250, the second stack metal 290, or both.

In one embodiment, the second metal liner 285 is Ti that has a thickness of about 15 Å, the second stack metal 290 is W that has a thickness of about 300 Å, and the surface metal layer 295 is Cu that has a thickness of about 20 Å.

Deposition of Aligned Metal Containing Features

Figure 1D:
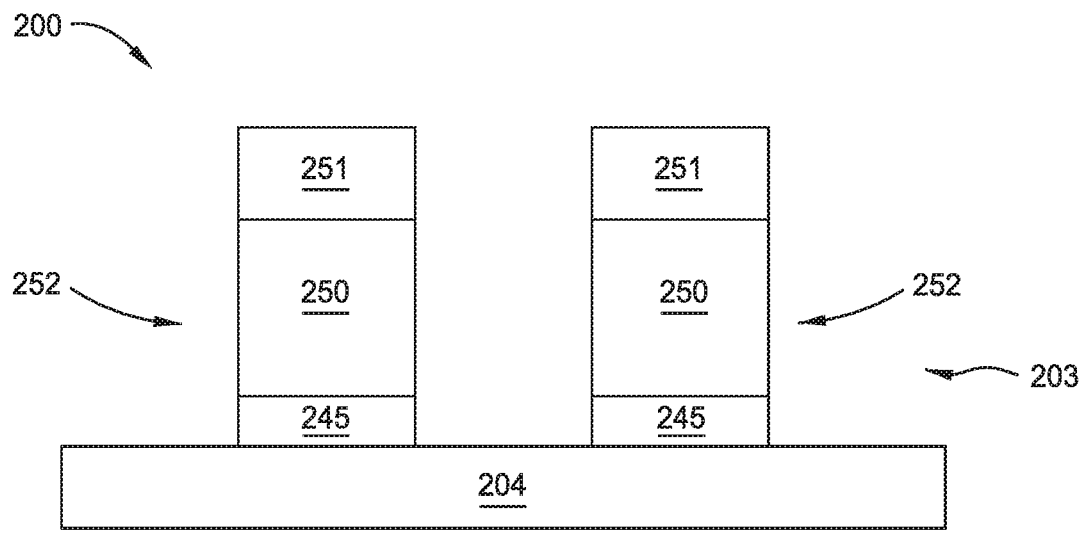
FIG. 1D illustrates a schematic side view of a third plurality of interconnect layers, according to one embodiment.

Referring to FIGS. 1A and 1D-1N, a method 101 for forming desirable aligned metal containing features in a layered structure is described, according to one or more embodiments of the disclosure provided herein. FIG. 1D illustrates one or more layered structures 252 of the third plurality of interconnect layers 203. The layered structures 252 are disposed over the substrate 204. The layered structures 252 include metal liner 245, stack metal 250, and dielectric cap 251. The metal liner 245 is disposed over the substrate 204 and patterned to form discrete regions. The stack metal 250 is disposed over the metal liner 245. A dielectric cap 251 is disposed over the stack metal 250. The dielectric cap 251 includes silicon dioxide ($SiO_2$), silicon nitride ($Si_xN_y$), silicon carbonitride (SiCN), or aluminum oxide ($Al_xO_y$), according to one embodiment.

Figure 1E:
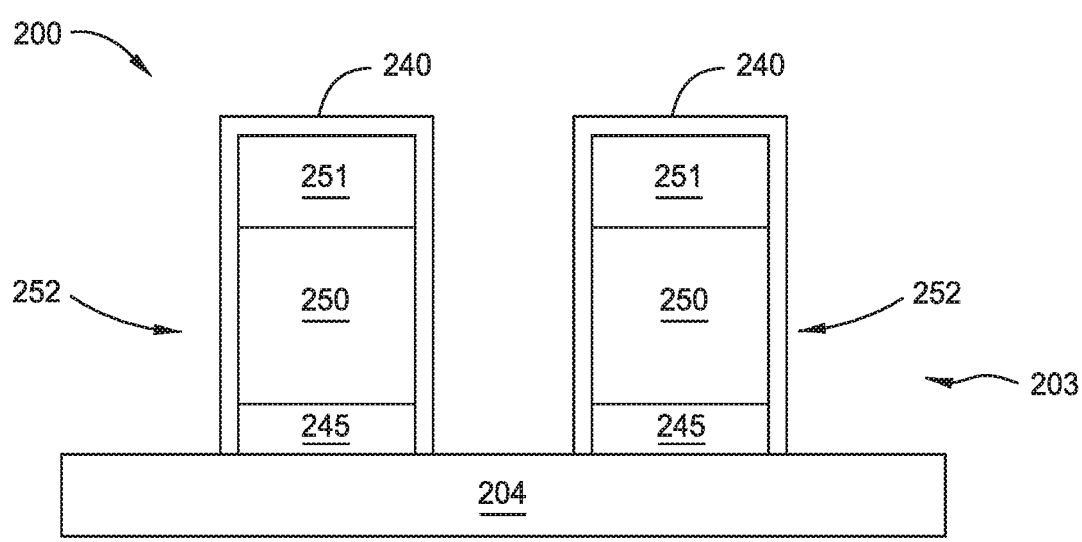
FIG. 1E illustrates a schematic side view of the third plurality of interconnect layers of FIG. 1D after a dielectric liner is deposited, according to one embodiment.

The method begins at operation 111, as shown in FIG. 1E, where a dielectric liner 240 is selectively deposited. The dielectric liner 240 lines the sides and top of the layered structures 252, such that the dielectric liner covers the metal liner 245, the stack metal 250, and the dielectric cap 251. In one embodiment, the dielectric liner 240 includes aluminum oxide, the deposition chemistry used is triethylaluminum ($Al(C_2H_5)_3$) and water, the temperature is about 300° C., and the deposition is performed for about 60 seconds.

Figure 1F:
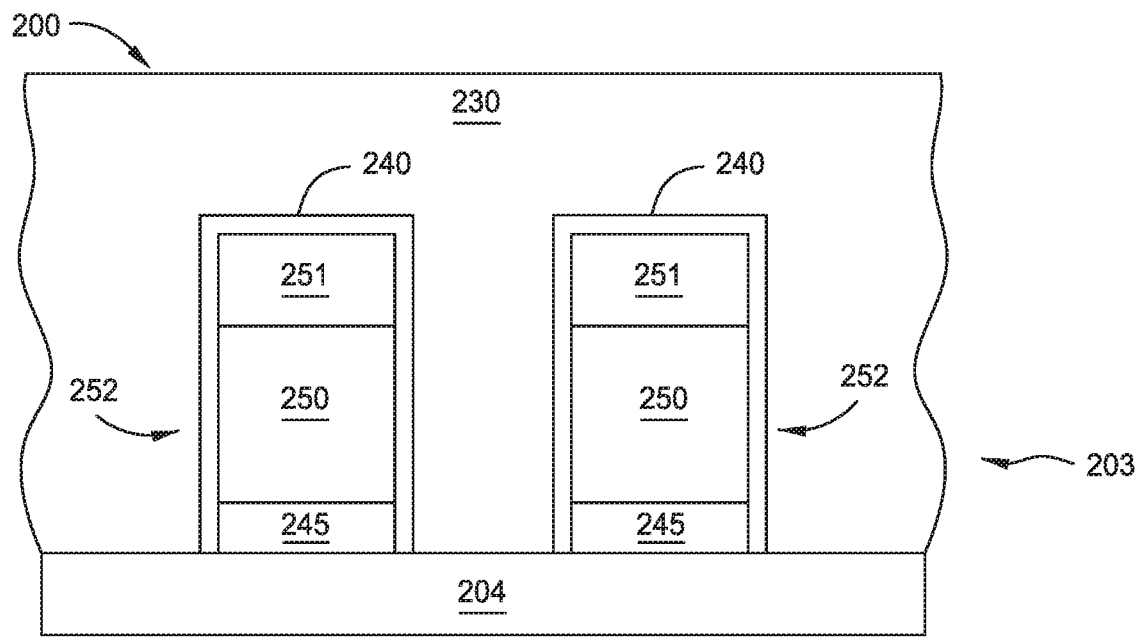
FIG. 1F illustrates a schematic side view of the third plurality of interconnect layers of FIG. 1E after a filler dielectric is deposited, according to one embodiment.

At operation 121, as shown in FIG. 1F, the filler dielectric 230 is deposited. The filler dielectric 230 at least fills the space between adjacent layered structures 252. The filler dielectric 230 also partially or completely covers the tops of the layered structures 252. In one embodiment, the filler dielectric 230 includes silicon dioxide, the deposition chemistry used is tris(dimethylamino)silane and hydrogen peroxide, the temperature is about 450° C., and the deposition is performed for about 60 seconds.

Figure 1G:
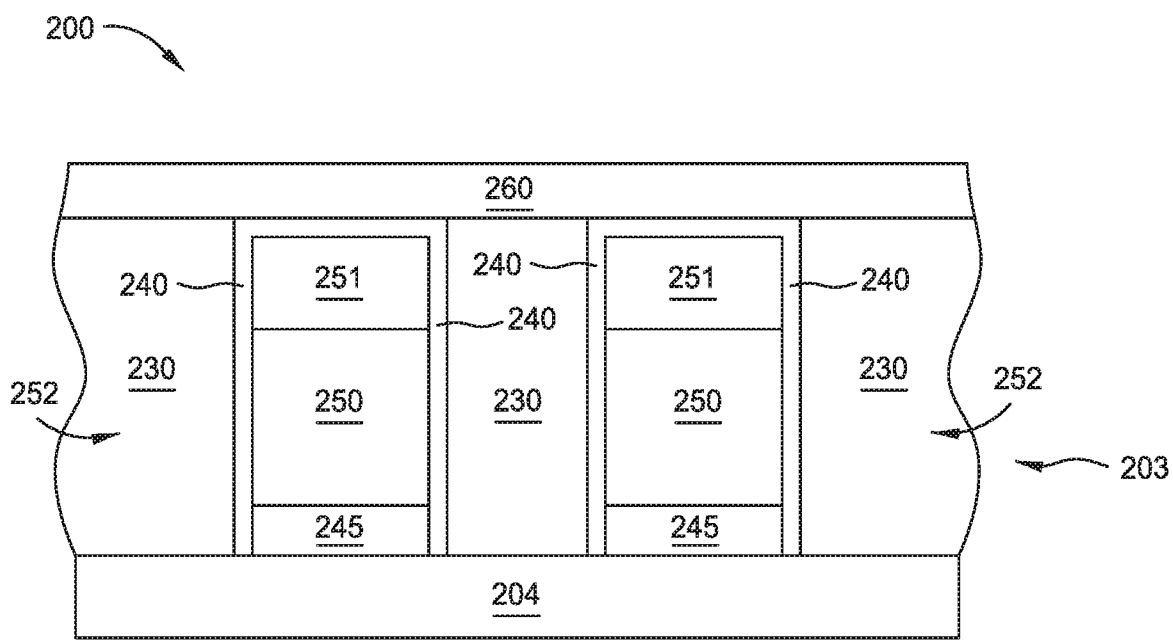
FIG. 1G illustrates a schematic side view of the third plurality of interconnect layers of FIG. 1F after a dielectric stop is deposited, according to one embodiment.

At operation 131, as shown in FIG. 1G, the excess filler dielectric 230 is removed, such that the height of the filler dielectric in between the layered structures 252 is about the same height of the layered structures. The excess filler dielectric 230 is removed using a chemical mechanical polishing (CMP) process, according to one embodiment.

After the excess filler dielectric 230 is removed, the dielectric stop 260 is deposited, such that the dielectric stop 260 is disposed over the layered structures 252 and the filler dielectric 230 disposed between the layered structures. In one embodiment, the dielectric stop 260 includes aluminum oxide, the deposition chemistry used is triethylaluminum ($Al(C_2H_5)_3$) and water, the temperature is about 300° C., and the deposition is performed for about 60 seconds.

A selective liner can be deposited after the CMP process, which protects the underlying filler dielectric 230 from etching as described below. The selective liner includes aluminum oxide ($Al_xO_y$), according to one embodiment.

Figure 1H:
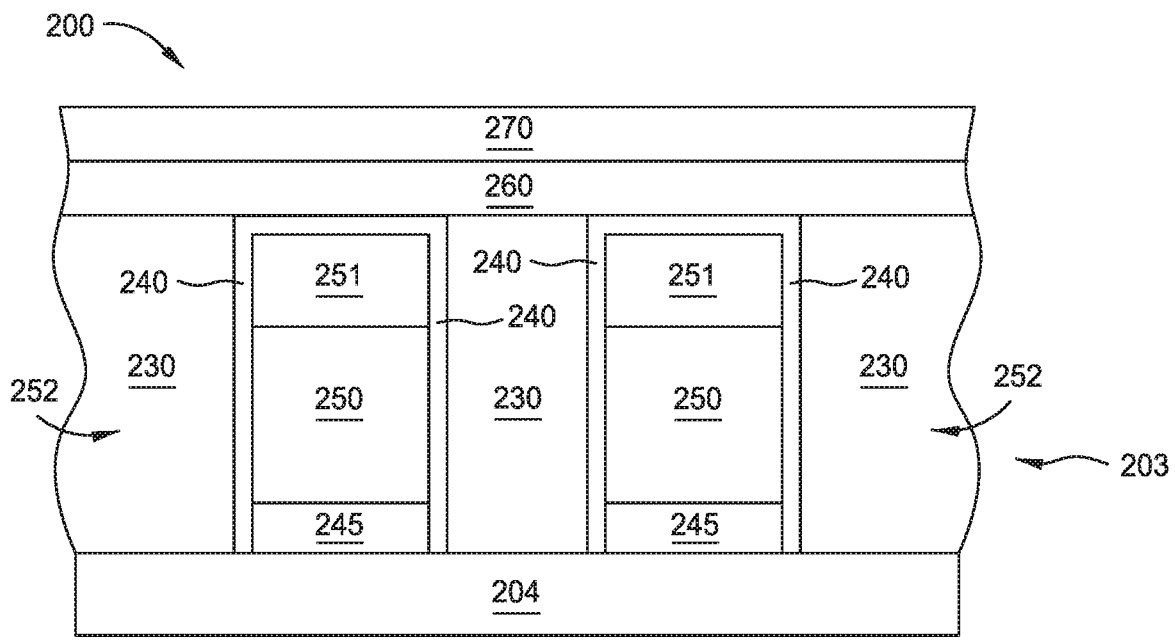
FIG. 1H illustrates a schematic side view of the third plurality of interconnect layers of FIG. 1G after a secondary dielectric layer is deposited, according to one embodiment.

At operation 141, as shown in FIG. 1H, the secondary dielectric layer 270 is deposited over the dielectric stop 260. In one embodiment, the secondary dielectric layer 270 includes aluminum oxide, the deposition chemistry used is triethylaluminum ($Al(C_2H_5)_3$) and water, the temperature is about 300° C., and the deposition is performed for about 60 seconds.

Figure 1I:
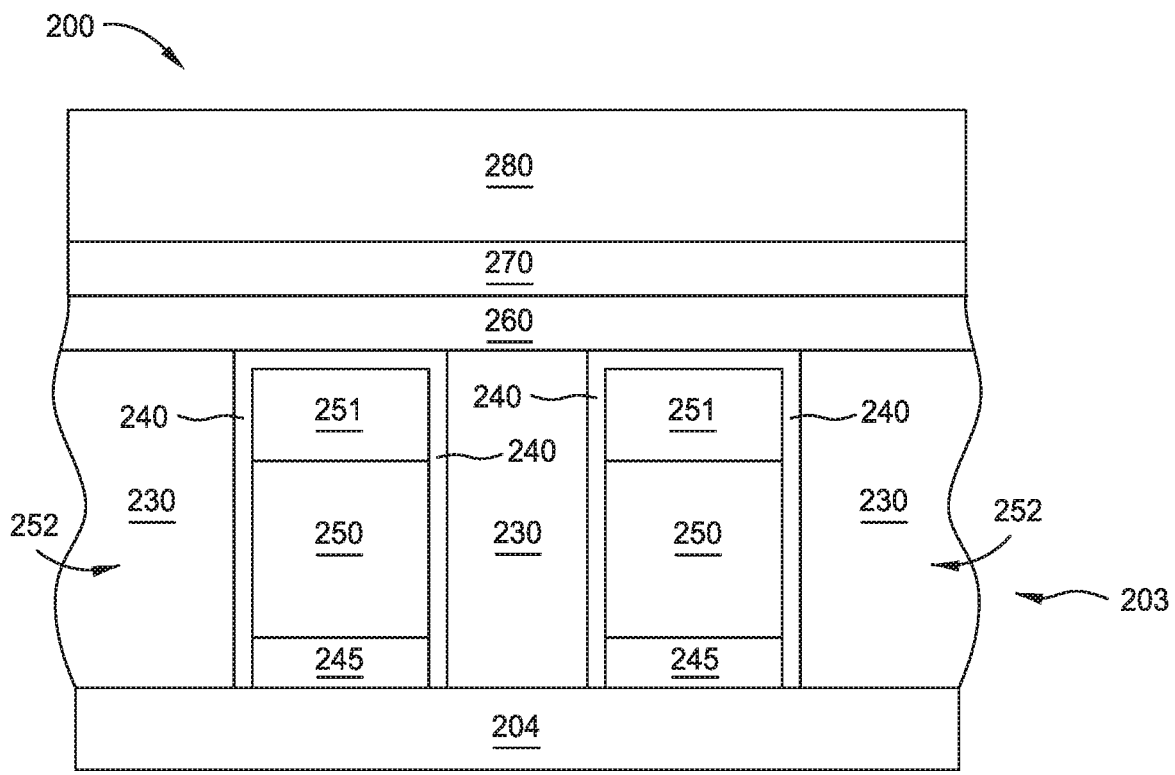
FIG. 1I illustrates a schematic side view of the third plurality of interconnect layers of FIG. 1H after a second filler dielectric is deposited, according to one embodiment.

At operation 151, as shown in FIG. 1I, the second filler dielectric 280 is deposited over the dielectric stop 260. The surface of the second filler dielectric 280 can be smoothed by a CMP process. In one embodiment, the second filler dielectric 280 includes silicon dioxide, the deposition chemistry used is tris(dimethylamino)silane and hydrogen peroxide, the temperature is about 450° C., and the deposition is performed for about 60 seconds.

Figure 1J:
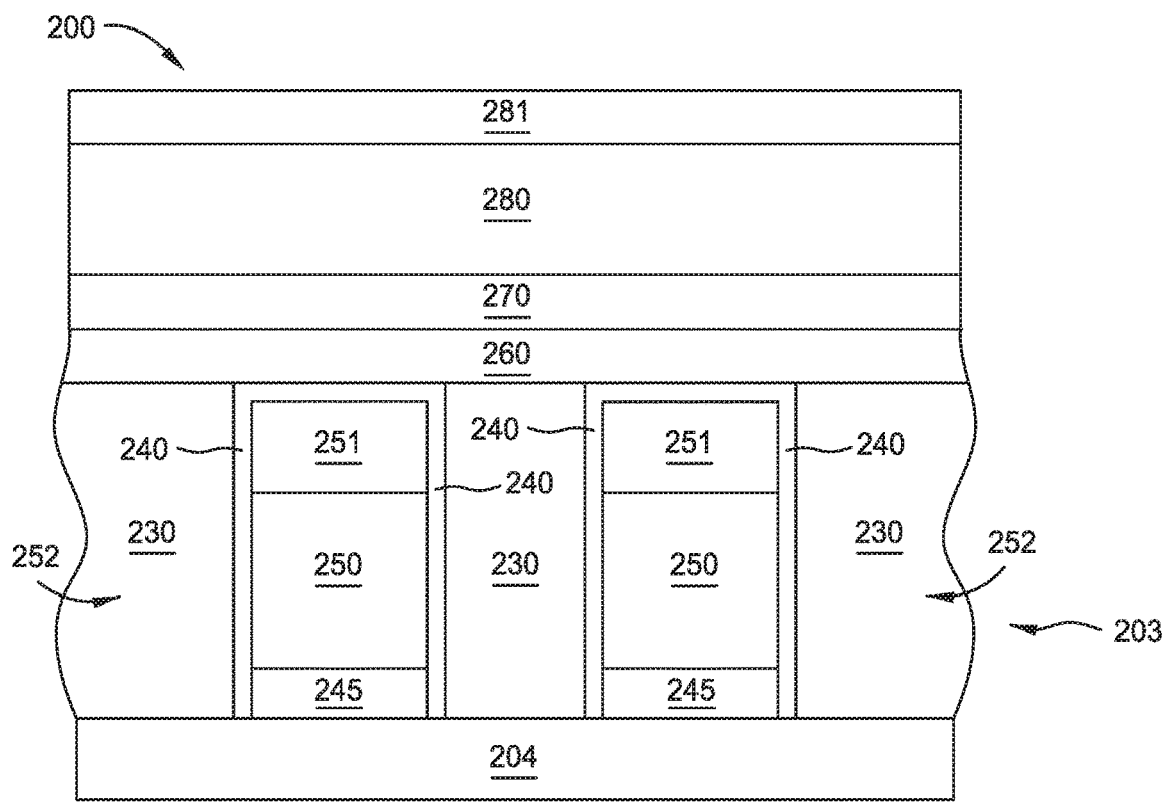
FIG. 1J illustrates a schematic side view of the third plurality of interconnect layers of FIG. 1I after a secondary pattern mask is deposited, according to one embodiment.

At operation 161, as shown in FIG. 1J, a secondary pattern mask 281 is deposited over the second filler dielectric 280. The secondary pattern mask 281 allows the selective etching or deposition of material on the underlying layers, as the pattern mask protects certain regions from unwanted etching in subsequent processes. In one embodiment, the secondary pattern mask 281 includes a photoresist material. In another embodiment, the secondary pattern mask 281 includes a deposited layer of self-assembled monolayers (SAMs). The second pattern mask 281 can include carbon (C). The second pattern mask 281 can include amorphous carbon.

In one embodiment, the secondary pattern mask 281 includes amorphous carbon, the deposition chemistry used is propene and hydrogen gas, the temperature is about 550° C., and the deposition is performed for about 60 seconds.

Figure 1K:
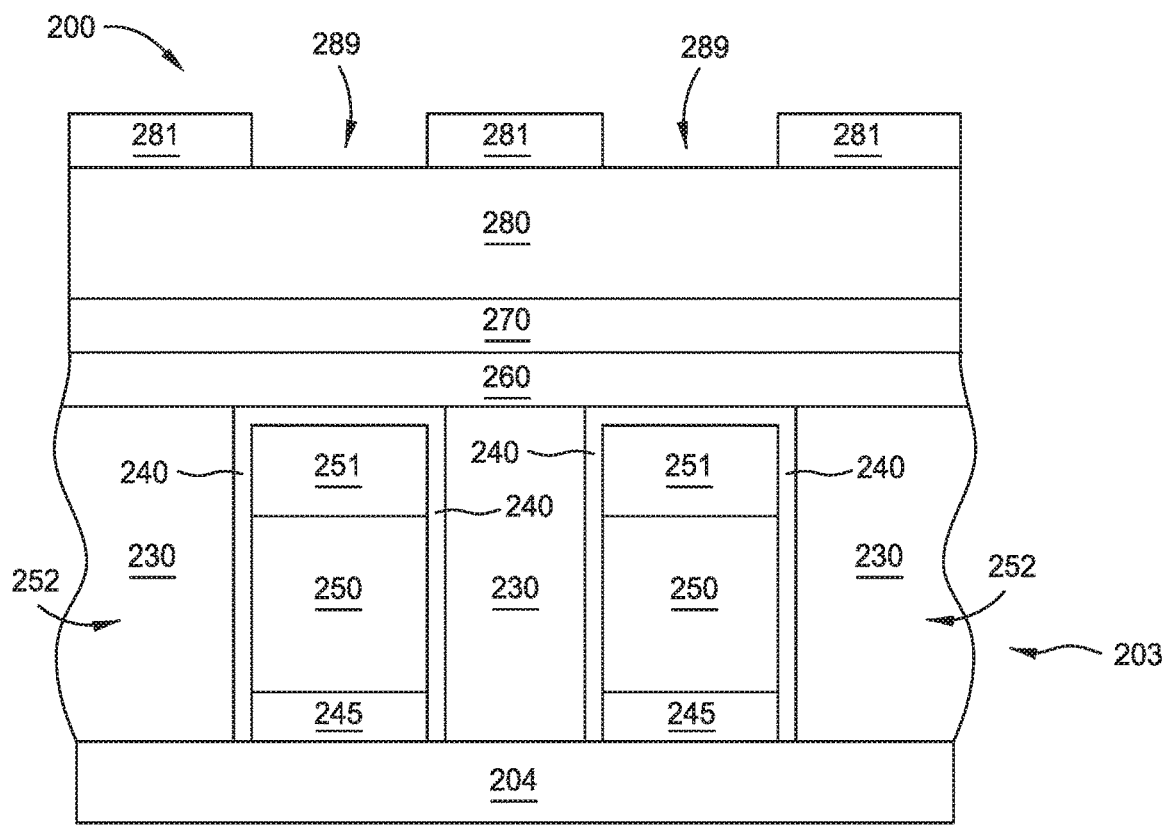
FIG. 1K illustrates a schematic side view of the third plurality of interconnect layers of FIG. 1J after one or more openings are opened in the secondary pattern mask, according to one embodiment.

At operation 171, as shown in FIG. 1K, one or more openings 289 are formed in the secondary pattern mask 281. The secondary pattern mask 281 can include a photoresist material and the openings are formed by a lithography technique, which may include applying ultraviolet (UV) light to the secondary pattern mask 281 that includes a UV sensitive photoresist material, according to one embodiment.

Figure 1L:
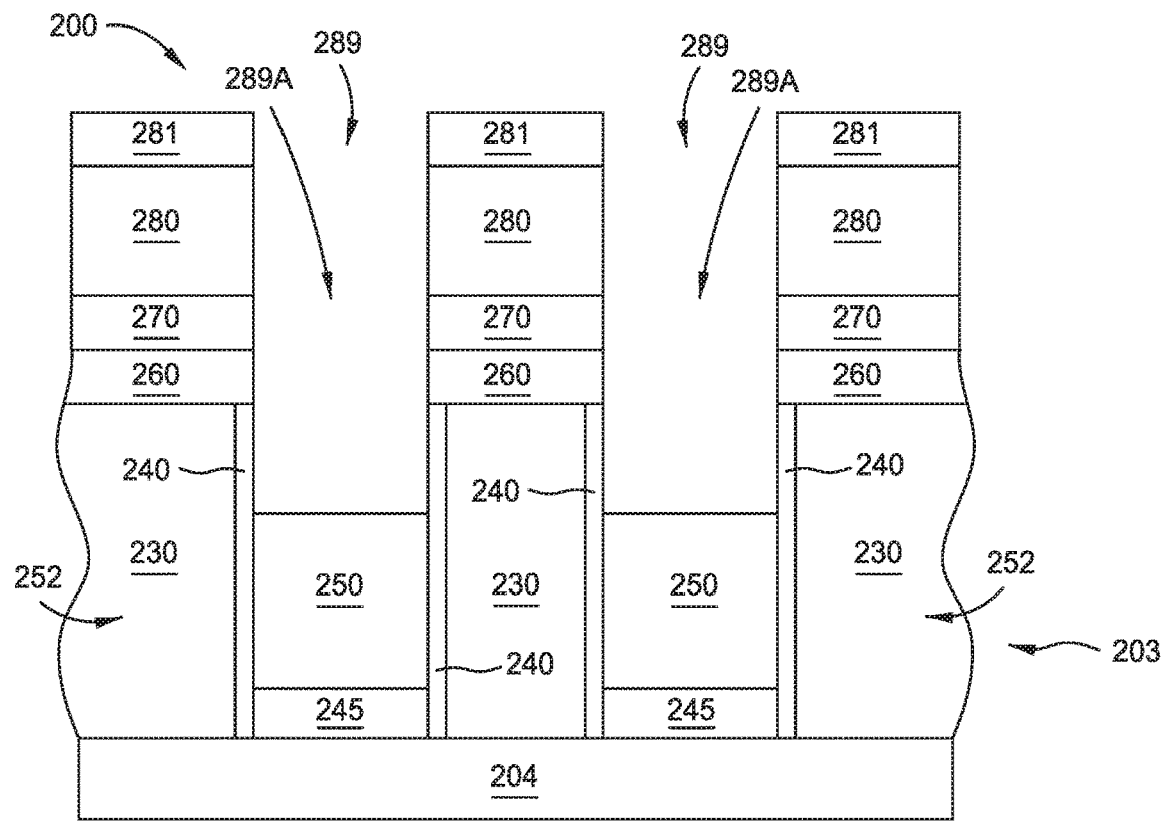
FIG. 1L illustrates a schematic side view of the third plurality of interconnect layers of FIG. 1K after a portion of the layers are selectively etched, according to one embodiment.

At operation 181, as shown in FIG. 1L, the layers are etched through the openings 289 in the secondary pattern mask 281, such that a portion 289A of the metal containing feature 220 is exposed. The etching performed on the layers is a dry plasma etch that is performed in a single operation etching process that is able to anisotropically etch the materials formed in the second filler dielectric 280, the secondary dielectric layer 270, the dielectric stop 260, the dielectric liner 240, and the dielectric cap 251. The single operation etching process used to in this case generally will selectively etch the materials in the in the second filler dielectric 280, the secondary dielectric layer 270, the dielectric stop 260, the dielectric liner 240, and the dielectric cap 251 versus the material(s) in the stack metal 250. In some embodiments, the plasma chemistry used contains fluorine (F), oxygen (O), or chlorine (Cl). In some embodiments, the plasma chemistry used is fluoroform ($CHF_3$) and oxygen gas ($O_2$), chlorine gas ($Cl_2$) and $O_2$, or sulfur hexafluoride ($SF_6$) and $O_2$. In one embodiment, the plasma chemistry used is fluoroform and oxygen gas, the temperature is about 40° C., a radio frequency (RF) power of 20 W is provided, and the etch is performed for about 60 seconds.

Alternately, in one embodiment of operation 181, the etching process performed is a dry plasma etch process that is performed using multiple etching process operations. The multiple operation etching process can include one or more etching operations that are able to anisotropically etch the materials formed in some of the layers, but stops on the material used to form in other layers. Then, during a second, or subsequent, etching operation, the material in the other layers. A plurality of etching operations can be performed in this manner. In some embodiments, the dry etch chemistry used is $CHF_3$ and $O_2$, $Cl_2$ and $O_2$, or $SF_6$ and $O_2$.

Figure 1M:
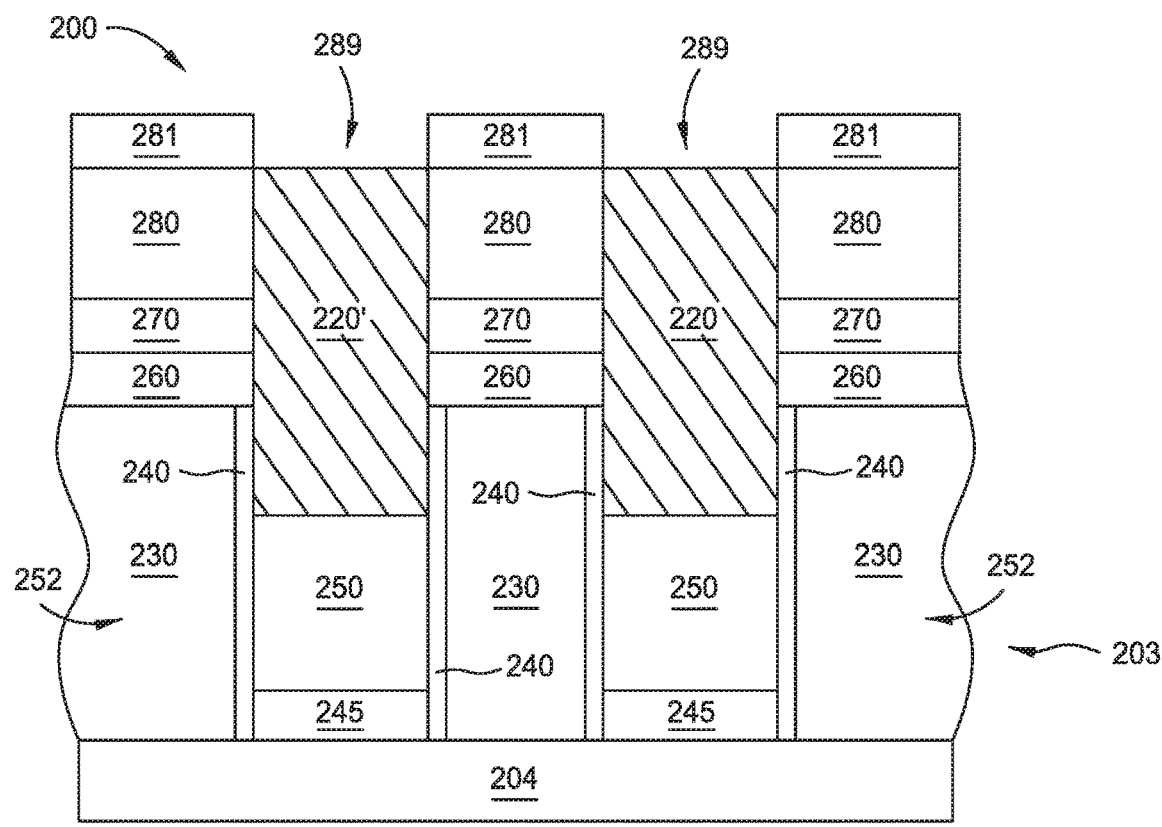
FIG. 1M illustrates a schematic side view of the third plurality of interconnect layers of FIG. 1L after a metal containing feature is deposited, according to one embodiment.

In operation 191, as shown in FIG. 1M, a metal containing feature 220 is selectively deposited in the portion 289A over the stack metal 250. In some embodiments, the metal containing feature 220 is selectively deposited on the stack metal 250 due to a catalytic reaction process (e.g., electroless deposition, selective CVD deposition, or other similar process) with the stack metal, according to one embodiment. Even if the secondary pattern mask 281 is misaligned with the substrate 204, the metal containing features 220 will be correctly aligned, because the metal containing feature is selectively deposited on the stack metal 250, and the stack metal is correctly aligned to the substrate.

The top of the metal containing feature 220 can be at the height of the second filler dielectric 280, the height of the dielectric liner 240, or anywhere in between. The deposition of the metal containing feature 220 can be selective, such that the metal containing feature only grows on the underlying stack metal 250. The removal of the dielectric cap 251 via etching in operation 181 provides a surface of the stack metal 250 to be used for deposition of the metal containing feature 220. In this manner, the method 101 provides for a natural alignment of the metal contain feature with the layered structures 252.

Figure 1N:
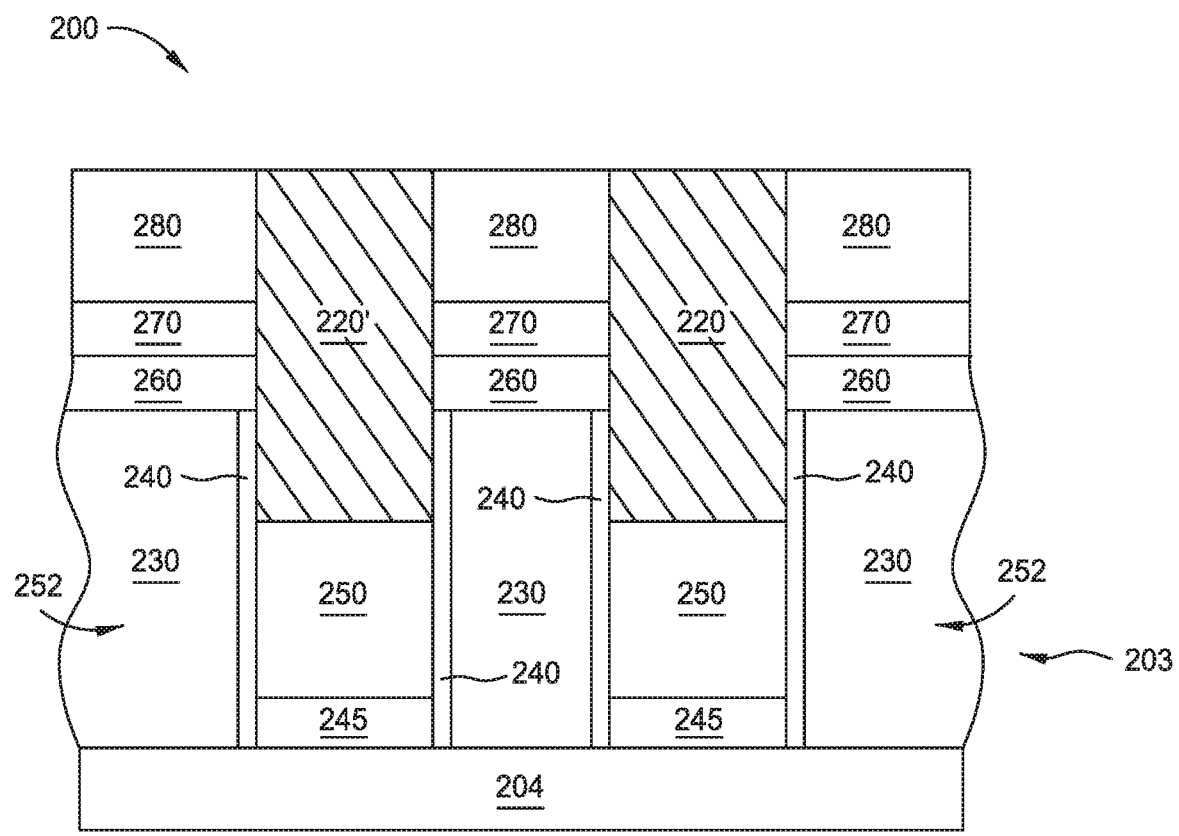
FIG. 1N illustrates a schematic side view of the third plurality of interconnect layers of FIG. 1, after the secondary pattern mask is removed, according to one embodiment.

In operation 195, as shown in FIG. 1N, the secondary pattern mask 281 is removed. The secondary pattern mask 281 can be removed with a plasma etch. In one embodiment, the plasma chemistry used is water, the temperature is about 250° C., a radio frequency (RF) power of 500 W is provided, and the etch is performed for about 60 seconds.

After the method of 101 is complete, further processing can be performed on the third plurality of interconnect layers 203. In one embodiment, further dielectric or metal layers are deposited on the surface of the metal containing feature 220. The third plurality of interconnect layers 203 as described herein can be the foundation of further modifications of the plurality of interconnect layers 200, as described elsewhere in the application.

As described above, one or more layered structures 252 are disposed over the substrate 204. One or more layers are deposited on the layered structures 252. A secondary pattern mask 281 is deposited over the layers. A selective etch selectively removes the layers disposed over the one or more layered structures 252, and removes the dielectric caps 251, so that the stack metals 250 are exposed. Metal containing features 220 are selectively deposited on the stack metals 250.

The selective deposition of metal containing features 220 on the stack metals 250 in the layered structures 252 results in aligned metal containing features 220. The layered structures 252 are already grown on the substrate 204 such that the layered structures are aligned in a predetermined pattern. As the metal containing features 220 are only deposited on the stack metals 250, this ensures that the metal containing features 220 are aligned as well.

Partial Self-Aligned Subtractive Etch Flow

Figure 2A:
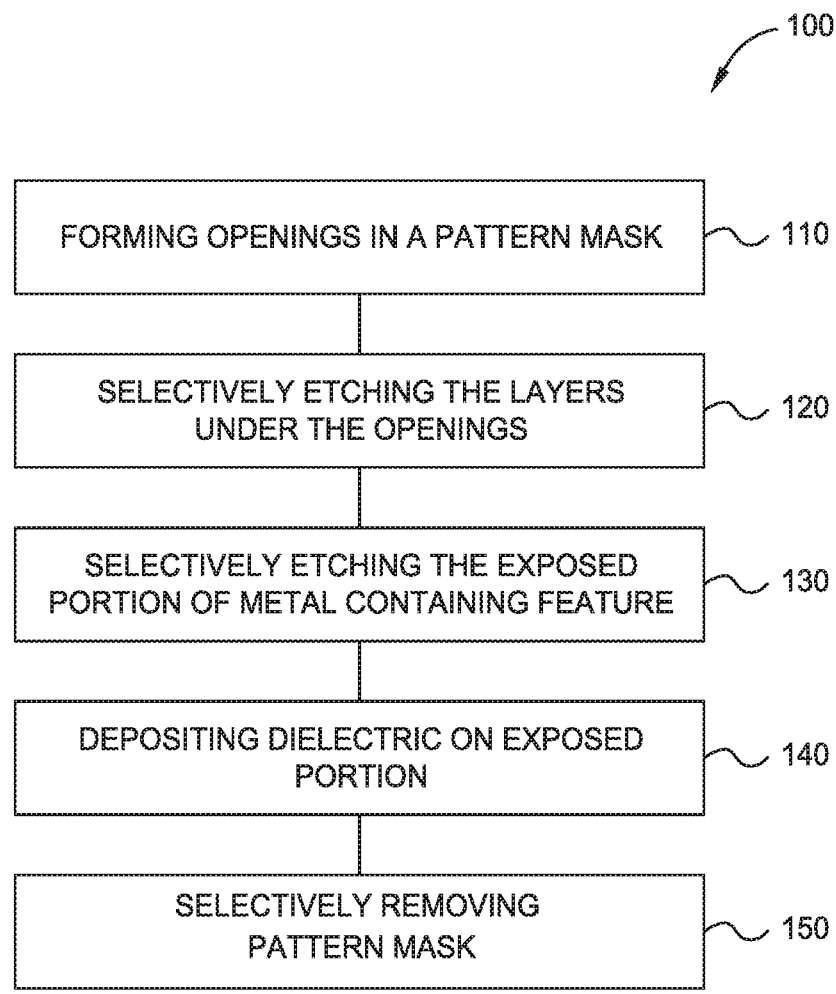
FIG. 2A is a flow chart of method operations for self-alignment of a metal containing feature, according to one embodiment.
Figure 2B:
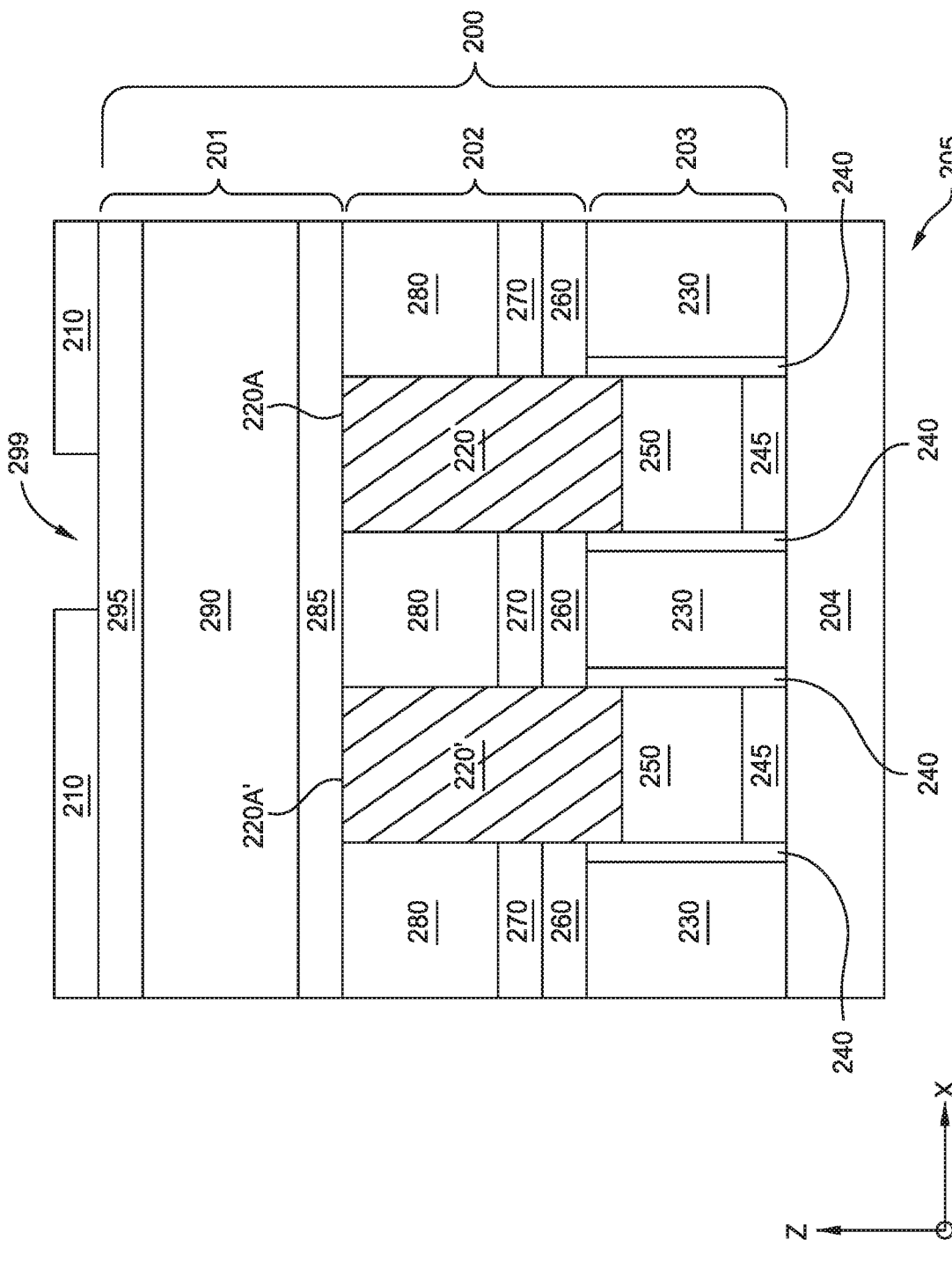
FIG. 2B illustrates a schematic side view of the interconnect stack of FIG. 1B with openings formed in the pattern mask, according to one embodiment.

Referring to FIGS. 2A-2G, a method 100 for forming desirable self-aligned metal containing features in a layered structure is described, according to one or more embodiments of the disclosure provided herein. The method begins at operation 110, where one or more openings 299 (FIG. 2B) are formed in the pattern mask 210 that is disposed over the first plurality of interconnect layers 202, the second plurality of interconnect layers 201, and the third plurality of interconnect layers 203. The pattern mask 210 can include a photoresist material and the openings are formed by a lithography technique, which may include applying ultraviolet (UV) light to the pattern mask 210 that includes a UV sensitive photoresist material, according to one embodiment. FIG. 2B illustrates the plurality of interconnect layers 200 after operation 110 is performed. The openings 299 in the pattern mask 210 as shown are placed correctly, but the underlying metal containing features 220 are either not in the correct positions, or the widths are larger than desired as deposited. Thus, the one or more openings 299 in the pattern mask 210 are not aligned with and/or over the metal containing feature 220, 220'.

Figure 2C:
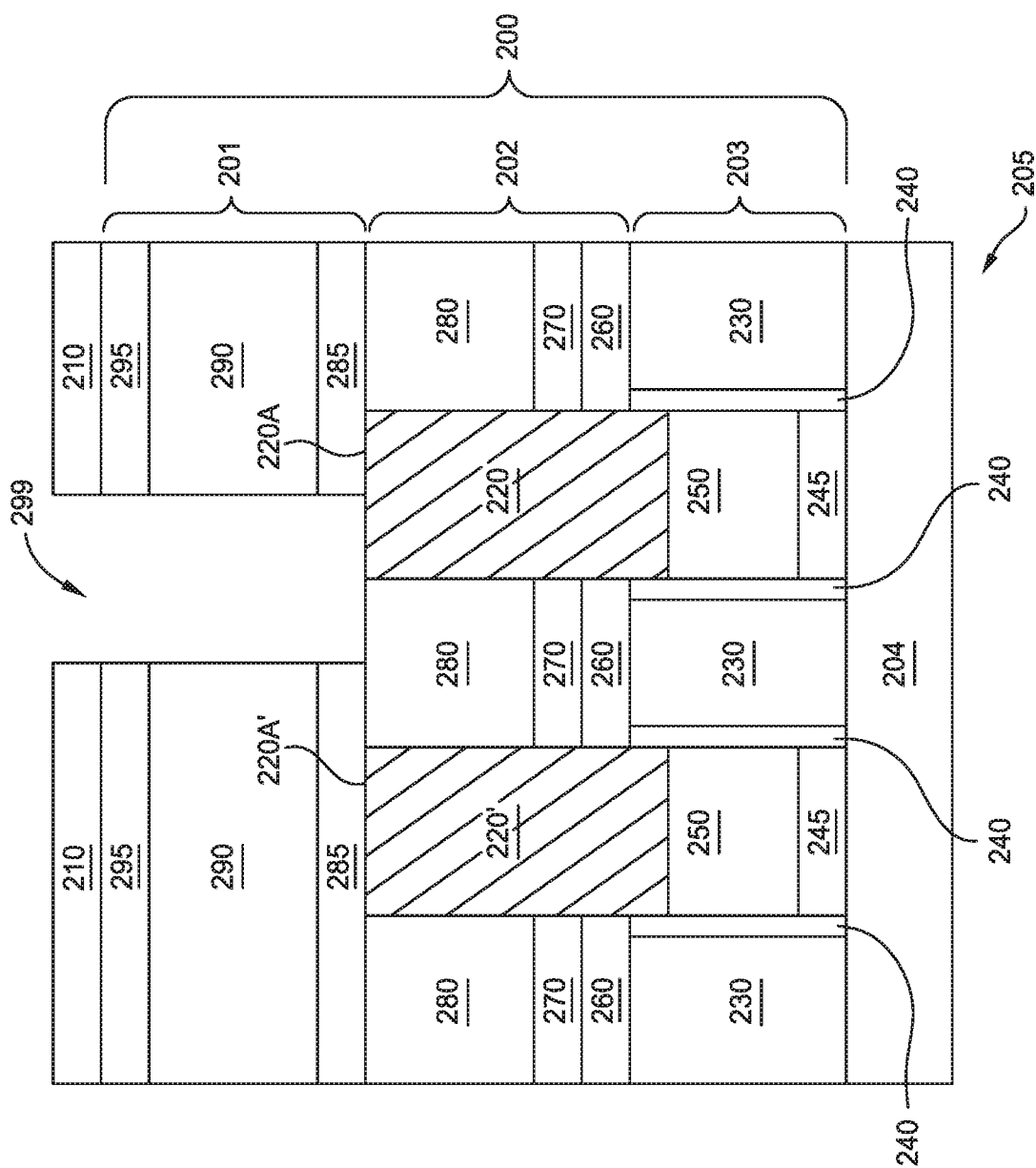
FIG. 2C illustrates a schematic side view of the interconnect stack of FIG. 2B with a metal containing feature exposed, according to one embodiment.

At operation 120, as shown in FIG. 2C, the layers in the second plurality of interconnect layers 201 are etched through the openings in the pattern mask 210, such that a portion of the metal containing feature 220A is exposed. FIG. 2C illustrates the plurality of interconnect layers 200 after operation 120 is performed, according to one embodiment. The etching performed on the plurality of interconnect layers 200 is a dry plasma etch that is performed in a single operation etching process that is able to anisotropically etch the materials formed in the surface metal layer 295, the second stack metal 290 and the second metal liner 285. The single operation etching process used to in this case generally will selectively etch the materials in the surface metal layer 295, the second stack metal 290 and the second metal liner 285 versus the material(s) in the second filler dielectric 280. In some embodiments, the plasma chemistry used contains F, O or Cl. In some embodiments, the plasma chemistry used is $CHF_3$ and $O_2$, $Cl_2$ and $O_2$, or $SF_6$ and $O_2$.

In one embodiment, the plasma chemistry used is fluoroform and oxygen gas, the temperature is about 40° C., a radio frequency (RF) power of 20 W is provided, and the etch is performed for about 60 seconds.

Alternately, in one embodiment of operation 120, the etching process performed is a dry plasma etch process that is performed using multiple etching process operations. The multiple operation etching process can include one or more etching operations that are able to anisotropically etch the materials formed in the surface metal layer 295 and the second stack metal 290, but stops on the material used to form the second metal liner 285. Then, during a second, or subsequent, etching operation, the material in the second metal liner 285 is removed to expose the material(s) in the second filler dielectric 280 and at least a portion of the material in the metal containing features 220. In general, the etching operation used to remove the material in the second metal liner 285 is selective relative to the material(s) in the second filler dielectric 280. In some embodiments, the dry etch chemistry used is $CHF_3$ and $O_2$, $Cl_2$ and $O_2$, or $SF_6$ and $O_2$.

In some embodiments, a protection chemical is added to the side of the second metal liner 285, which protects the side of the metal liner from being etched by the above mentioned chemistries, and prevents the metal liner from oxidizing. In one embodiment, the protection chemical is $CH_4$, and the etch chemistry used is HBr. In another embodiment, the protection chemistry can be added to the side of any of the layers in the plurality of interconnect layers 200.

Figure 2D:
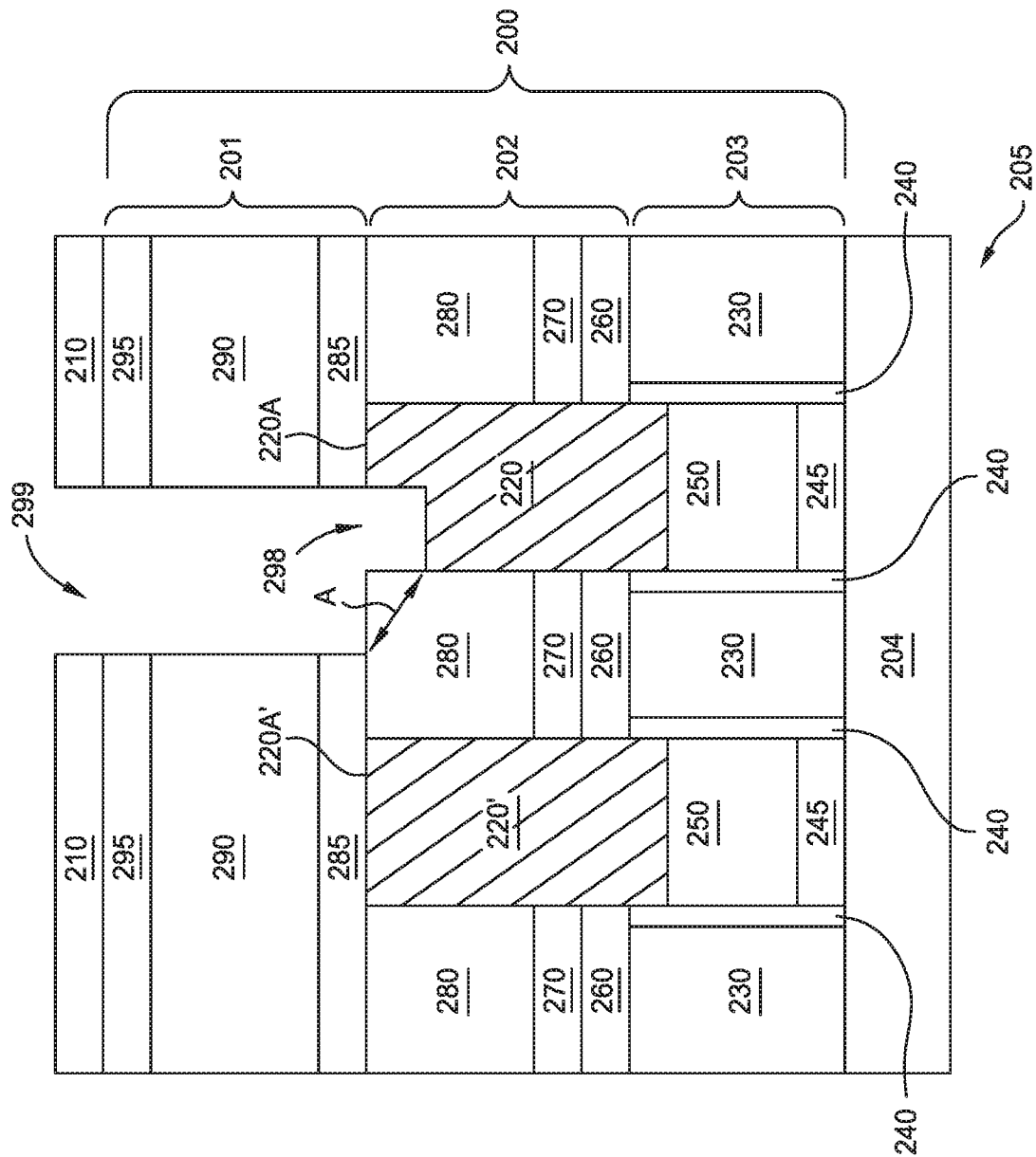
FIG. 2D illustrates a schematic side view of the interconnect stack of FIG. 2C with a portion of a metal containing feature etched, according to one embodiment.

At operation 130, the portion of the metal containing feature 220 that was exposed by the prior operation 120 is selectively etched. FIG. 2D illustrates the plurality of interconnect layers 200 after operation 130 is performed, according to one embodiment. In one embodiment, the etching performed is a dry plasma etch process that is able to anisotropically etch the exposed material in the metal containing feature 220. In another embodiment, the plasma chemistry used contains F or Cl. In some embodiments, the plasma chemistry used is $CHF_3$ and $O_2$, $Cl_2$ and $O_2$, or $SF_6$ and $O_2$. In one embodiment, the method of etching is chosen that can etch both the second plurality of interconnect layers 201 and the metal containing feature 220, and as such the operation 130 is performed simultaneously with the later portion of operation 120. In some embodiments, the etch is an atomic layer etch, and the depth of the etch can be controlled by the number of cycles of the etch. In this process, the depth of the etch is typically less than about 30% of the total thickness of the as deposited metal containing feature 220. In some embodiments, operation 130 is a continuation of the single etch process operation, described above, or is part of the last sub-operation of the multiple operation etching process (i.e., the second metal liner 285 etching operation) described above. In either case the etch chemistry and process is selected so that is selectively removes the material in the metal containing feature 220 versus the material(s) in the second filler dielectric 280.

In one embodiment, the plasma chemistry used is fluoroform and oxygen gas, the temperature is about 40° C., a radio frequency (RF) power of 20 W is provided, and the etch is performed for about 60 seconds.

Figure 2E:
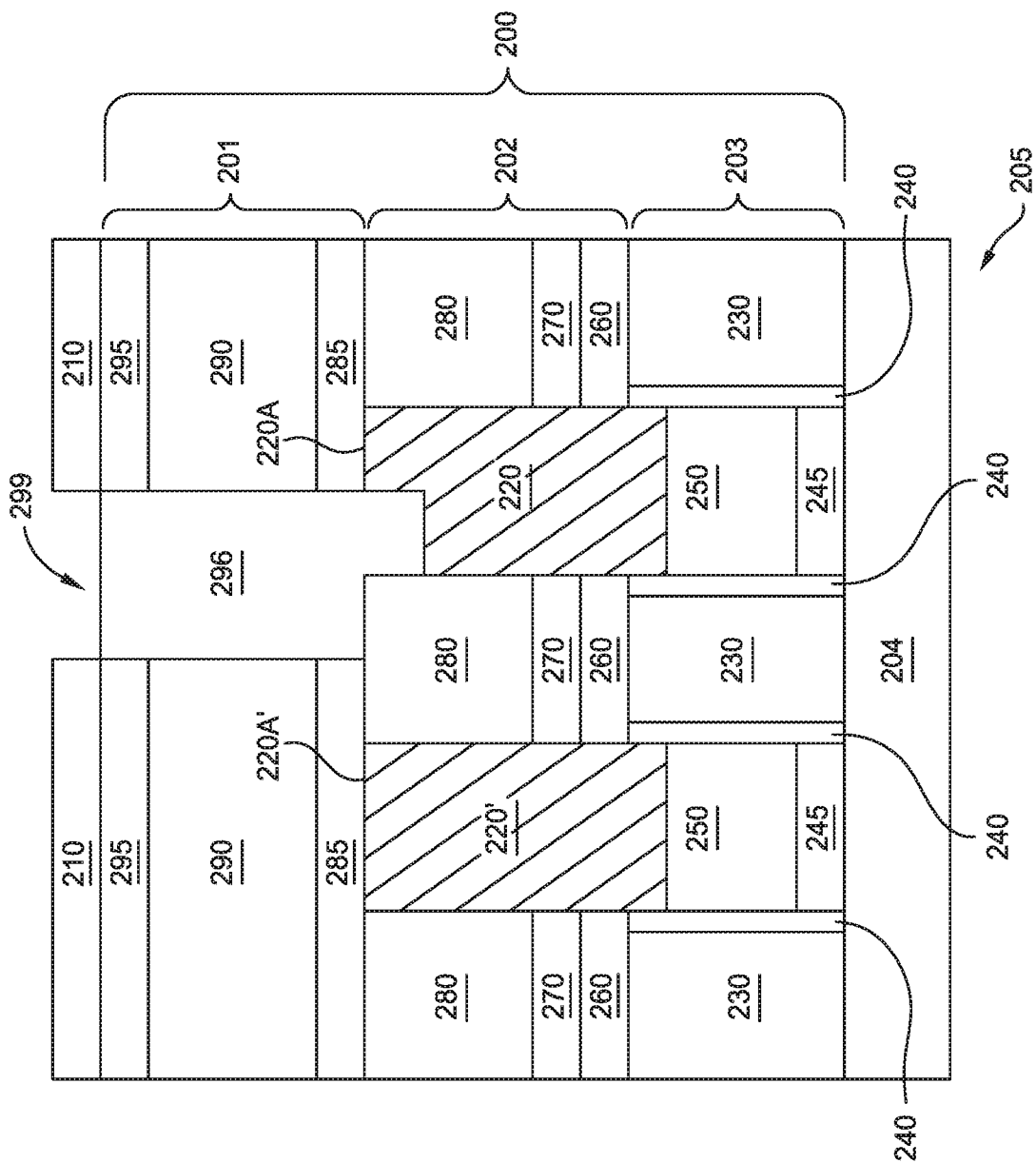
FIG. 2E illustrates a schematic side view of the interconnect stack of FIG. 2D with a dielectric deposited thereon, according to one embodiment.

At operation 140, the portions of the interconnect layers 200 that were etched in operations 120, 130 is filled by a surface filler 296. FIG. 2E illustrates the plurality of interconnect layers 200 after operation 140 is performed, according to one embodiment. The surface filler 296 can be deposited by PVD, CVD, ALD, or the like. In one embodiment, the surface filler 296 that fills the opening formed after performing operations 120 and 130 is a dielectric material. In this configuration, due to the shape of the formed opening and the presence of the surface filler material is used to further isolate the metal containing feature 220 from the interconnecting layers/components coupled to the adjacent metal containing feature 220'. The surface filler 296 can be a dielectric such as silicon dioxide or silicon nitride, according to one embodiment. In another embodiment, the surface filler 296 is a metal, such as Al, Cu, W, Ru, or Mo. In one embodiment, the height and planarization of the surface filler 296 is further controlled via a CMP process. In some embodiments, the portion of the second metal liner 285, the second stack metal 290, and the surface metal layer 295 that were etched during method 100 is selectively filled with the surface filler 296 (FIG. 2F) material. The surface filler 296 is a dielectric such as silicon dioxide, silicon nitride, silicon carbonitride, or silicon carboxide, according to one embodiment. The surface filler 296 is a metal such as Mo, Ru, W, Co, Ni, Cu, Al, Rh, Ir, or nickel silicide, according to one embodiment.

In some embodiments of operation 140, the portion of the second metal liner 285, the second stack metal 290, and the surface metal layer 295 that were etched during method 100 is filled with a conformally or at least semi-conformally deposited film (not shown) that fills the etched feature and covers at least a portion of the field region on the substrate with the surface filler 296 material. The material overburden formed on the field region by the conformal or at least semi-conformal deposition process can be removed by a subsequent CMP process.

In one embodiment, the surface filler 296 includes silicon dioxide, the deposition chemistry used is tris(dimethylamino)silane and hydrogen peroxide, the temperature is about 450° C., and the deposition is performed for about 60 seconds.

Figure 2F:
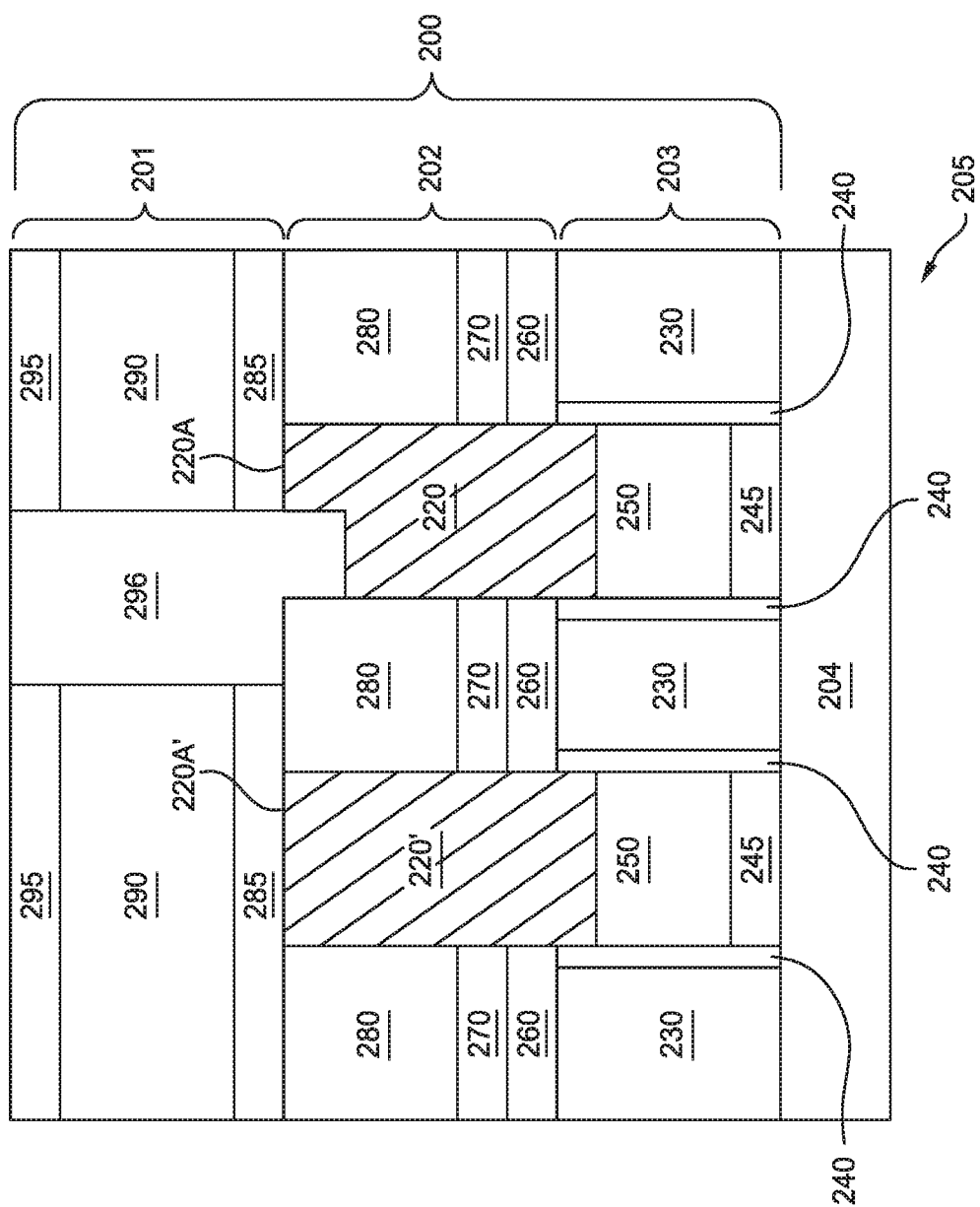
FIG. 2F illustrates a schematic side view of the interconnect stack of FIG. 2E with the pattern mask removed, according to one embodiment.

At operation 150, the pattern mask 210 is removed from the surface of the plurality of interconnect layers 200. FIG. 2F illustrates the plurality of interconnect layers 200 after operation 150 is performed, according to one embodiment. In some embodiments, operation 150 is performed before operation 140 is performed, and then a CMP process is performed on the surface filler 296 layer to remove any excess material that was formed on the surface of the second stack metal 290 interconnect layers 200 and planarize the surface of the substrate to the point shown in FIG. 2F. After the method of 100 is complete, further processing can be performed on the plurality of interconnect layers 200. In one embodiment, further dielectric or metal layers are deposited on the surface metal layer 295.

Figure 2G:
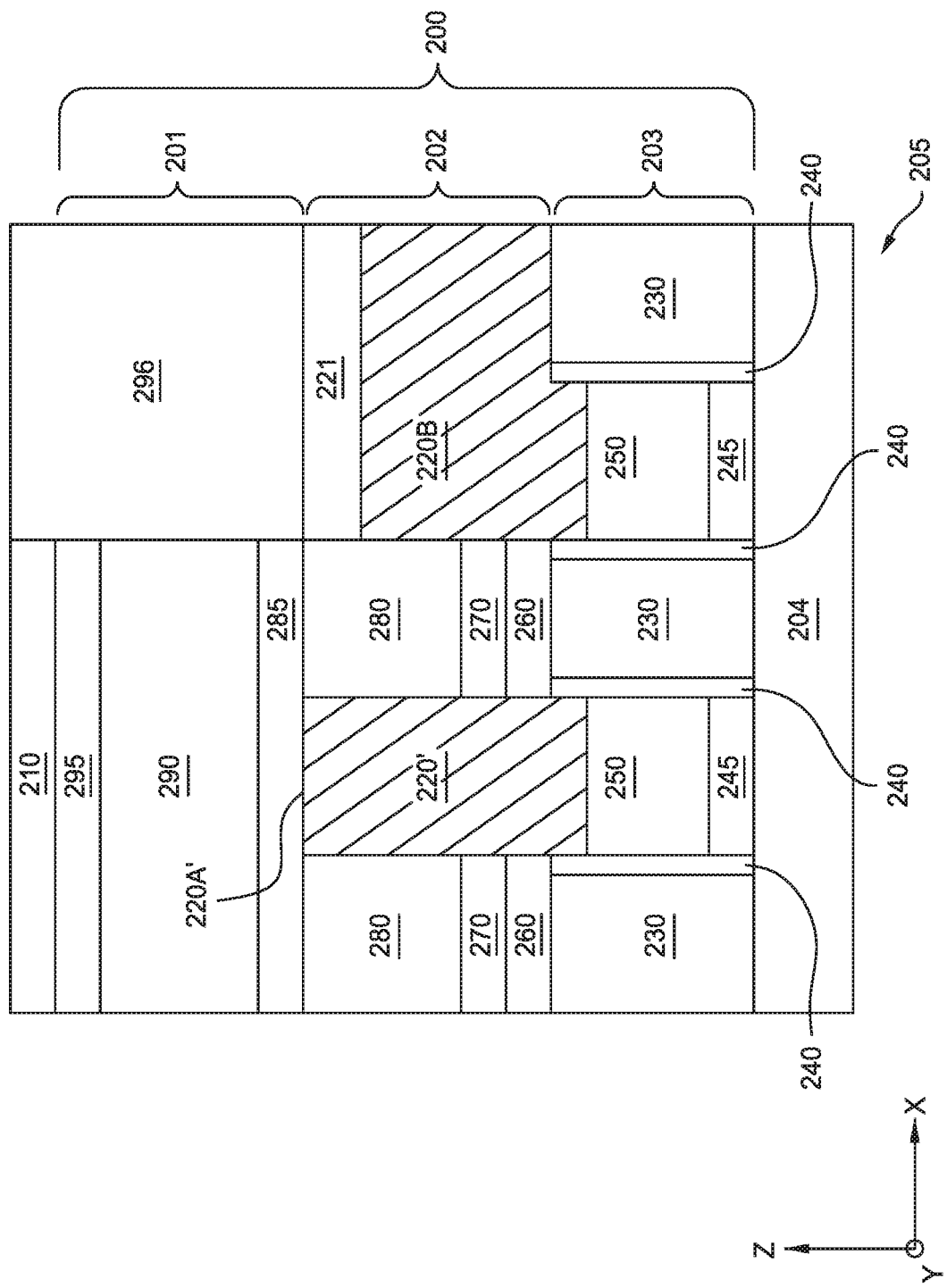
FIG. 2G illustrates a schematic side view of an interconnect stack with a secondary metal deposited on a metal containing feature, according to one embodiment.

FIG. 2G illustrates a schematic side view of an interconnect stack 205 with a secondary metal 221 deposited on a wide-metal containing feature 220B, according to one embodiment. The wide-metal containing feature 220B can be a trench, bit-line, word-line or other formed feature that has an undesirable thickness (Z-direction). In some cases, the undesirable thickness may be relative to a thickness of a formed metal layer in an adjacent metal feature, such as a metal containing feature 220' (e.g., contact, via), due to the relative size differences of these features. The addition of the secondary metal 221 on the surface of the metal in the wide-metal containing feature 220B is useful to reduce the electrical resistance of the formed interconnect structures by increasing the current carrying cross-sectional area of the wide-metal containing features. The formation of the secondary metal 221 on the wide-metal containing feature 220B can be completed after the surface of the wide-metal containing feature 220B is exposed after performing operations 110-130 over the wide-metal containing feature 220B and before operation 140 is performed over the wide-metal containing feature 220B. The formed secondary metal 221 is a metal, such as Mo, Ru, W, Co, Ni, Cu, Al, Rh, Ir, or nickel silicide, according to one embodiment. The secondary metal 221 includes the same material as the underlying metal containing feature 220, according to one embodiment. In some embodiments, the secondary metal 221 includes a different metal from the underlying metal containing feature 220. In some embodiments, the secondary metal 221 is selectively deposited on the metal containing feature 220 due to a catalytic reaction process (e.g., electroless deposition, selective CVD deposition, or other similar process) with the metal containing feature, according to one embodiment.

Referring back to FIGS. 1B-1C, it is typical for the metal containing features 220 to be misaligned in one or more directions by about 1 to 3 nm. In practice, there is always some misalignment of the metal containing features 220, and thus self-alignment processes described herein will improve the functioning of the plurality of interconnect layers 200. However, in some embodiments of the method 100, the metal containing features 220 are intentionally grown such that the widths of the metal containing features are larger than that of overlaying interconnect layers 201 and 203, which ensures that the metal containing feature is at least the width of the overlaying interconnect layers. Then, a self-alignment process is performed (i.e., method 100), so that the finally formed metal containing feature 220 has a desired width, is formed in the desired spot and has the desired spacing between adjacently formed metal containing features.

Thus, as discussed above, due to the presence of the surface filler 296 in the interconnect stack 205, the added gap 298 (FIG. 2D) formed within a portion of the metal containing feature 220 that is filled with a surface filler 296 will help to electrically isolate the metal containing feature 220 from conductive elements coupled to an adjacent metal containing feature 220'. As shown in FIG. 2D the formed gap 298 increases the distance between the material contained in the metal containing feature 220 and the conductive material found in the adjacent portions of the plurality of interconnect layers 201 (e.g., disconnected portions of layers 285, 290, 295 on left side of FIG. 2D) coupled to the metal containing feature 220'. Self-alignment is performed such that the distance between the metal containing features 220 and other metal layers is greater than or equal to about "A" (FIG. 2D), where "A" is the shortest distance between adjacent metal containing features.

The method 100 can be used even with one or more additional layers grown on top of the metal containing feature 220, in which case the method can be performed after electrical testing is conducted, so that the misalignment of the metal containing feature(s) can still be fixed. The method 100 is effective when correcting the misalignment of a metal containing feature(s) that are only slightly misaligned, either in placement or by width.

Complete Self-Aligned Subtractive Etch Flow

Figure 3:
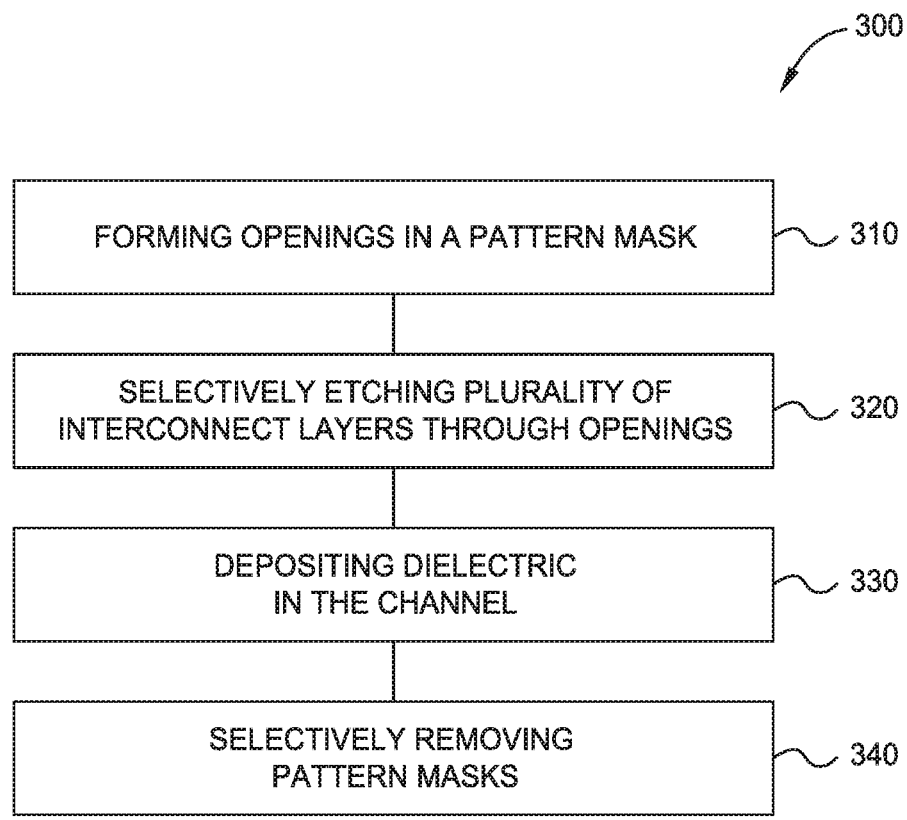
FIG. 3 is a flow chart of method operations for self-alignment of a metal containing feature, according to one embodiment.
Figure 4A:
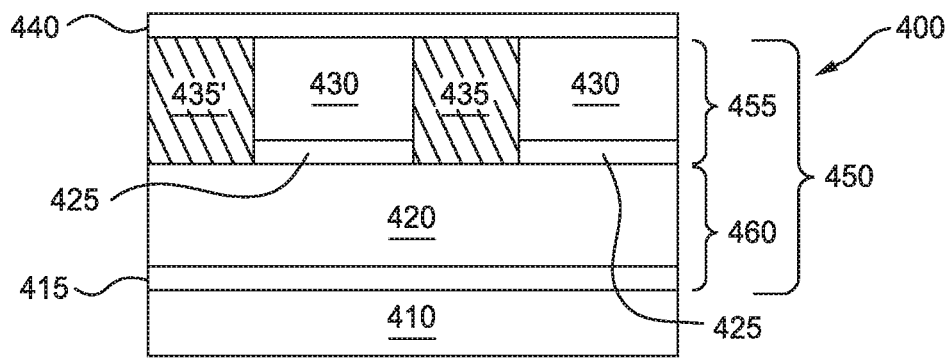
FIG. 4A illustrates a schematic side view of an interconnect stack, according to one embodiment.

FIG. 3 is a flow chart of a method 300 used to form a reliable self-aligned metal containing feature, according to one embodiment. FIG. 4A illustrates a schematic side view of a interconnect stack 400, according to one embodiment. As shown, the interconnect stack 400 includes a substrate 410, a plurality of interconnect layers 450, and a pattern mask 440. The pattern mask 440 is disposed over a plurality of interconnect layers 450. The pattern mask 440 allows the selective etching or deposition of material on the underlying plurality of interconnect layers 450, as the pattern mask protects certain regions from unwanted deposition or etching. In one embodiment, the pattern mask 440 is a photoresist material. In another embodiment, the pattern mask 440 includes a deposited layer that includes one or more self-assembled monolayers (SAMs). The pattern mask 440 can include carbon. The pattern mask 440 can include amorphous carbon.

The plurality of interconnect layers 450 are disposed over a substrate 410. In some embodiments, the substrate 410 is a flat, featureless wafer. In other embodiments, the substrate 410 is a patterned silicon wafer as is typically used in logic gates, I/O gates, field effect transistors, fin field effect transistors (finFETs), or memory applications. Substrate 410 may include a material such as crystalline silicon (e.g., Si<100> or Si<111>), silicon oxide, strained silicon, silicon germanium, doped or undoped polysilicon, doped or undoped silicon, patterned or non-patterned wafer, silicon on insulator (SOI), carbon-doped silicon oxides, silicon nitride, doped silicon, germanium, gallium arsenide, glass, sapphire, metal layers disposed on silicon, and the like. Substrate 410 may be configured as a 200 mm, 300 mm, or 450 mm diameter wafer, or as a rectangular or square panel. In one embodiment, the substrate 410 contains alignment marks (not shown) or other features on one or more surfaces to help position the pattern mask 440, and ensure that the correct layer pattern is grown or etched within the underlying plurality of interconnect layers 450. The components of the interconnect stack 400 work in concert to provide an initial interconnect that is used to form an improved self-aligned device.

In some embodiments, the initially formed interconnect stack 400 is used to form a self-aligned structure by etching one or more of the underlying layers and then the deposition of one or more dielectric or metal layers.

In some embodiments, the plurality of interconnect layers 450 include a second plurality of interconnect layers 455, and a first plurality of interconnect layers 460. The second plurality of interconnect layers 455 is disposed under the pattern mask 440, and over the first plurality of interconnect layers 460. The first plurality of interconnect layers 460 is disposed over the substrate 410. The components of the plurality of interconnect layers 450 work in concert to provide the interconnect stack 400 with all the necessary material layers to perform as an interconnect layer.

In some embodiments, the first plurality of interconnect layers 460 includes a metal liner 415, and a stack metal 420. The metal liner 415 is disposed over the substrate 410 and below the stack metal 420. In some embodiments, the metal liner 415 includes Ti, Ta, Ir, Pt, nitride thereof, or an alloy thereof. The stack metal 420 is disposed over the metal liner 415. The metal liner 415 improves the adhesion of the stack metal 420, and reduces grain size of the stack metal. In some embodiments, the stack metal 420 includes a refractory metal such as Mo, Ru, W, Co, Ni, Cu, Al, Rh, Ir, nickel silicide, or some combination of the above.

In one embodiment, the substrate 410 is a flat silicon wafer, the metal liner 415 is titanium nitride that has a thickness of about 15 Å, the stack metal 420 is tungsten, molybdenum, or ruthenium that has a thickness of about 300 Å, and the surface filler dielectric 465 is silicon dioxide that has a thickness of 100 Å.

In some embodiments, the second plurality of interconnect layers 455 include an oxide layer 425, a filler dielectric 430, and a metal containing feature 435. The interconnect layers listed below can be deposited via physical vapor deposition (PVD), chemical vapor deposition (CVD), atomic layer deposition (ALD), or other similar technique. The oxide layer 425 is disposed over the stack metal 420 and under the filler dielectric 430. The metal containing feature 435 is disposed over and in contact with the stack metal 420. The metal containing feature 435 is sandwiched between two adjacent sections of the oxide layer 425 and filler dielectric 430. In some embodiments, the metal containing feature 435 is a via, plug, trench, component of a transistor, or other semiconductor feature. The components of the second plurality of interconnect layers 455 include all of the necessary material layers to form the surrounding structure to form a proper functioning of a device.

In one embodiment, the oxide layer 425 is aluminum oxide that has a thickness of 10 Å, the filler dielectric 430 is silicon dioxide that has a thickness of about 100 Å, and the metal containing feature 220 is W that has a thickness of about 300 Å.

In general, the metal containing features 435 are intended to be lined up with the device formed on the substrate 410 in a pattern of metal containing features that have a specific width, and horizontal placement (perpendicular direction to the substrate). However, the metal containing features 435 can either be misplaced with respect to their desired position over the substrate 410, or the metal containing features can be grown with too large of a width due to lithography errors. The cause of these unwanted positions or width of the metal containing features 435 can be due to variation in alignment of the to be formed patterns to alignment marks, operator error, equipment malfunction, or general uncertainty due to the nanoscale level precision required for correct placement. In any case, it is not uncommon in the art for two adjacent metal containing features 435, 435' to be too close to one another in the horizontal direction. If this occurs, an unwanted short circuit can be formed horizontally, or an undesirably high capacitance is formed between the features with affect the RC constant of the formed device, which will cause a malfunction in the performance of the formed IC device. This unwanted short circuit can be remedied by the operations for self-alignment of a metal containing feature, as recited in the method operations below.

Figure 4B:
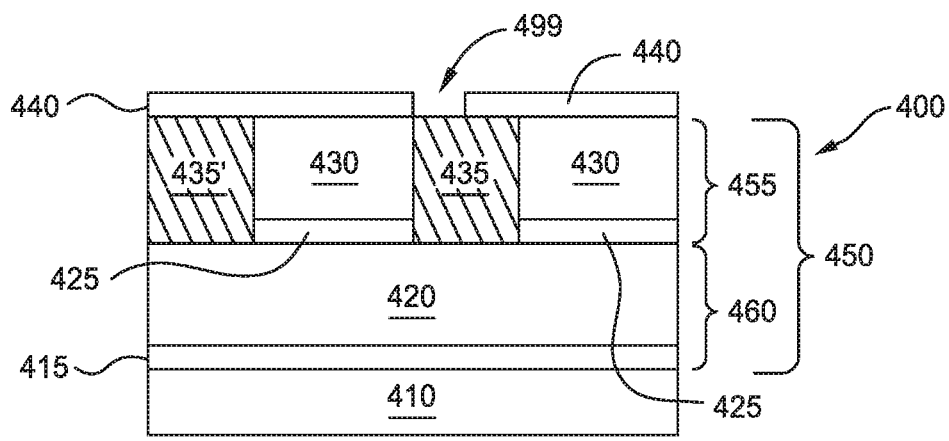
FIG. 4B illustrates a schematic side view of an interconnect stack with openings in the pattern mask, according to one embodiment.

Referring to FIGS. 3 and 4A-E, a method 300 for forming desirable self-aligned metal containing features in a layered structure is described, according to one or more embodiments of the disclosure provided herein. The method begins at operation 310, where one or more openings 499 are formed in the pattern mask 440 that is disposed over the first plurality of interconnect layers 460 and the second plurality of interconnect layers 455. The pattern mask 440 includes a photoresist material, and the openings 499 are formed by a lithography technique, which may include applying ultraviolet (UV) light to the pattern mask 440 that includes a UV-sensitive photoresist material, according to one embodiment. FIG. 4B illustrates the plurality of interconnect layers 450 after operation 310 is performed. The openings 499 in the pattern mask 440 as shown are placed correctly, but the underlying metal containing features 435 are either not in the correct lateral positions, or the widths are larger than desired as deposited. Thus, the one or more openings 499 in the pattern mask 440 are not aligned with a desired edge of metal containing feature 435, but is formed over at least a portion of the metal containing features 435.

Figure 4C:
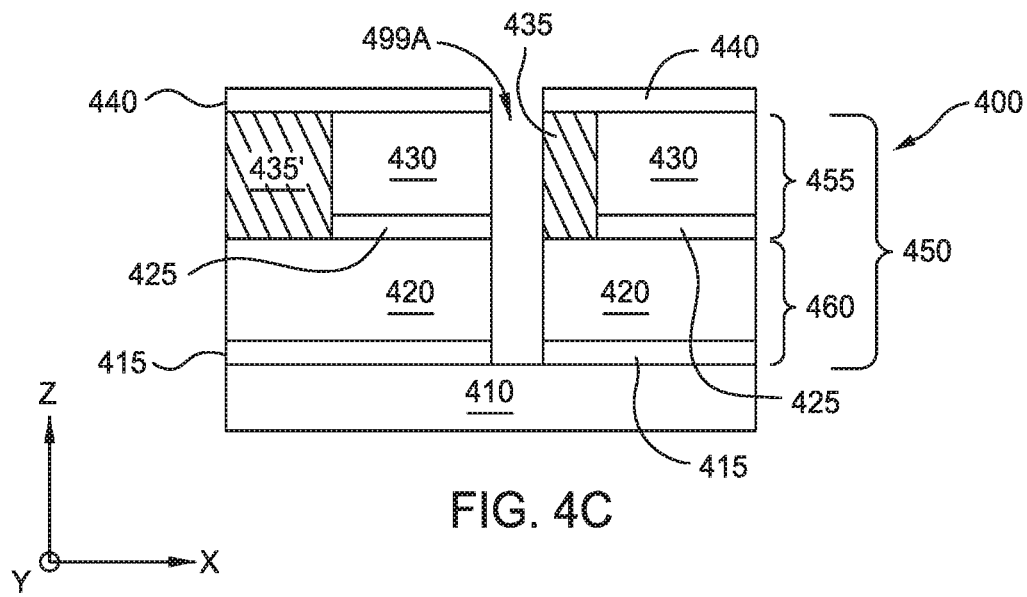
FIG. 4C illustrates a schematic side view of an interconnect stack after a dielectric is deposited in the channel, according to one embodiment.

At operation 320, the layers in the plurality of interconnect layers 450 are etched through the openings 499 in the pattern mask 440, such that a portion of the surface of the substrate 410 is exposed, and a channel 499A is created. FIG. 4C illustrates the interconnect stack 400 after operation 320 is performed, according to one embodiment. In some embodiments, the processes performed in operation 320 are also used to electrically isolate portions of the layers formed in first plurality of interconnect layers 460 from each other. In this case, an underlying circuit structure within the first plurality of interconnect layers 460 can be desirably formed and aligned with the interconnecting features found in the second plurality of interconnect layers 455.

In one embodiment of operation 320, the etching performed is a dry plasma etch. In some embodiments, the plasma chemistry used contains F, O or Cl. In some embodiments, the plasma chemistry used is $CHF_3$ and $O_2$, $Cl_2$ and $O_2$, $SF_6$ and HBR, or $SF_6 O_2$. In one embodiment, the plasma chemistry used is fluoroform and oxygen gas, the temperature is about 20-100° C., a radio frequency (RF) power of 20 W is provided, and the etch is performed for about 60 seconds.

Alternately, in one embodiment of operation 320, the etching process performed is a dry plasma etch process that is performed using multiple etching process operations. The multiple operation etching process can include one or more etching operations that are able to anisotropically etch the materials formed in the metal containing feature 435, the and the stack metal 420, but stops on the material used to form the metal liner 415. Then, during a second, or subsequent, etching operation, the material in the metal liner 415 is removed to expose the material(s) in the substrate 410. In general, the etching operation used to remove the material in the metal liner 415 is selective relative to the material(s) in the metal containing feature 435.

In some embodiments, a protection chemical is added to the side of the oxide layer 425, which protects the side of the metal liner 415 from being etched by the above mentioned chemistries. In one embodiment, the protection chemical is $CH_4$, and the etch chemistry used is HBr. In another embodiment, the protection chemistry can be added to the side of any of the layers in the plurality of interconnect layers 200.

In one embodiment, the etching of the metal containing feature 435, the stack metal 420, and the metal liner 415 are performed with the same plasma chemistry. In another embodiment, the etching of the metal containing feature 435, and the stack metal 420 and metal liner 415 are performed in separate operations, with separate plasma chemistries. In some embodiments, the openings 499 in the pattern mask 440 are placed such that the operation 320 also etches a portion of the oxide layer 425 and filler dielectric 430.

Figure 4D:
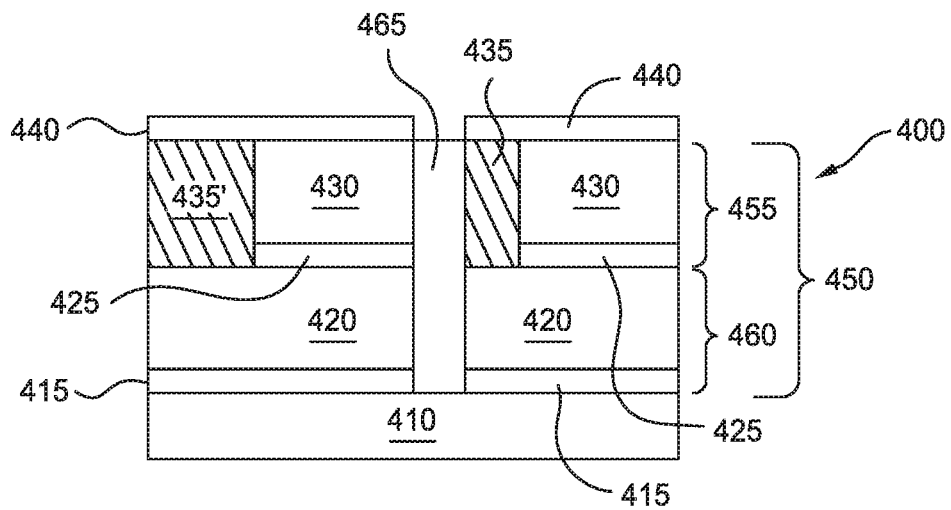
FIG. 4D illustrates a schematic side view of an interconnect stack after a dielectric is deposited in the channel, according to one embodiment.

At operation 330, after the channel 499A formed within the plurality of interconnect layers 450, the channel 499A is filled by a surface filler dielectric 465. FIG. 4D illustrates the plurality of interconnect layers 450 after operation 330 is performed, according to one embodiment. The surface filler dielectric 465 can be deposited by PVD, CVD, ALD, or the like. The surface filler dielectric 465 is used to isolate the metal containing feature 435 from an adjacent metal containing feature 435', and can be similarly formed using the process(es) described above in method 100.

Figure 4E:
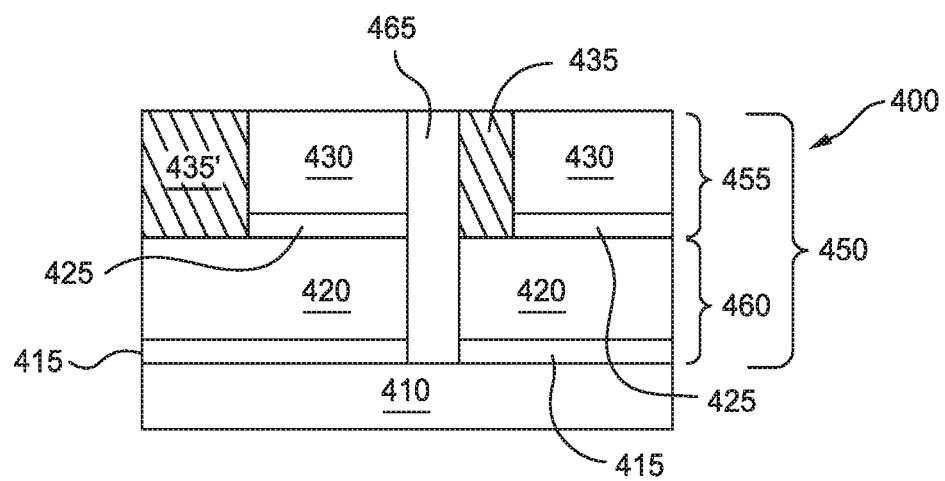
FIG. 4E illustrates a schematic side view of an interconnect stack, according to one embodiment.

At operation 340, the pattern mask 440 is removed from the surface of the plurality of interconnect layers 450. FIG. 4E illustrates the plurality of interconnect layers 450 after operation 340 is performed, according to one embodiment. After the method of 300 is complete, further processing can be performed on the interconnect stack 400. In one embodiment, the height and planarization of the surface filler dielectric 465 is further controlled via a CMP process. In one embodiment, further dielectric or metal layers are deposited on the interconnect stack 400. In some embodiments, a portion of the metal liner 415 and the stack metal 420 has been etched during the method 300 (FIG. 4C). In some embodiments, the portion of the metal liner 415 and the stack metal 420 that has been etched is filled by a surface filler dielectric 465 (FIG. 4D). The surface filler dielectric 465 is silicon dioxide, silicon nitride, silicon carbonitride, or silicon carboxide, according to one embodiment. In some embodiments, a portion of the metal containing feature 435 has been etched during the method 300 (FIG. 4C). In some embodiments, the portion of the metal containing feature 435 that has been etched is filled by a surface filler dielectric 465 (FIG. 4D). The surface filler dielectric 465 is silicon dioxide, silicon nitride, silicon carbonitride, or silicon carboxide, according to one embodiment.

As described above, the method 300 is used to correct placements and width of metal containing features 435 in an interconnect stack 400. In some embodiments, a selective etch, guided by a pattern mask 440, strips away a portion of a metal containing feature 435, and optionally one or more underlying layers (e.g., stack metal 420, metal liner 415), to form an opening 499, and the opening 499 is then filled with a surface filler dielectric 465.

The surface filler dielectric 465 is used to electrically isolate the metal containing feature 435 from an adjacent metal containing feature 435'. In addition, the method 300 can be used even with layers grown on top of the metal containing feature 435, so the method can be performed after electrical testing is conducted, and the misalignment of the metal containing feature 435 can still be fixed. The method 300 is especially effective when fixing the alignment of a metal containing feature 435 that is severely misaligned, either in placement or by width. However, this method is unnecessary for metal containing features 435 that are slightly misaligned, and only etching a small portion of the metal containing feature is likely to give enough improvement in electrical isolation between the metal containing feature and an adjacent metal containing feature 435'. In these cases, method 100 is less time-consuming and labor intensive, as given above.

Air Gap Formation

Figure 5:
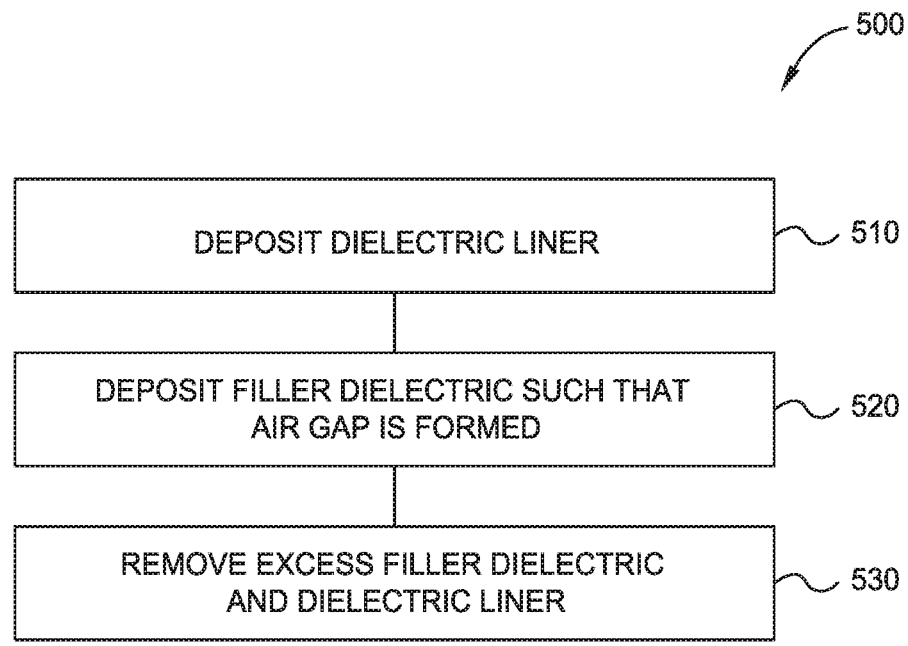
FIG. 5 is a flow chart of method operations of forming an air gap, according to one embodiment.
Figure 6A:
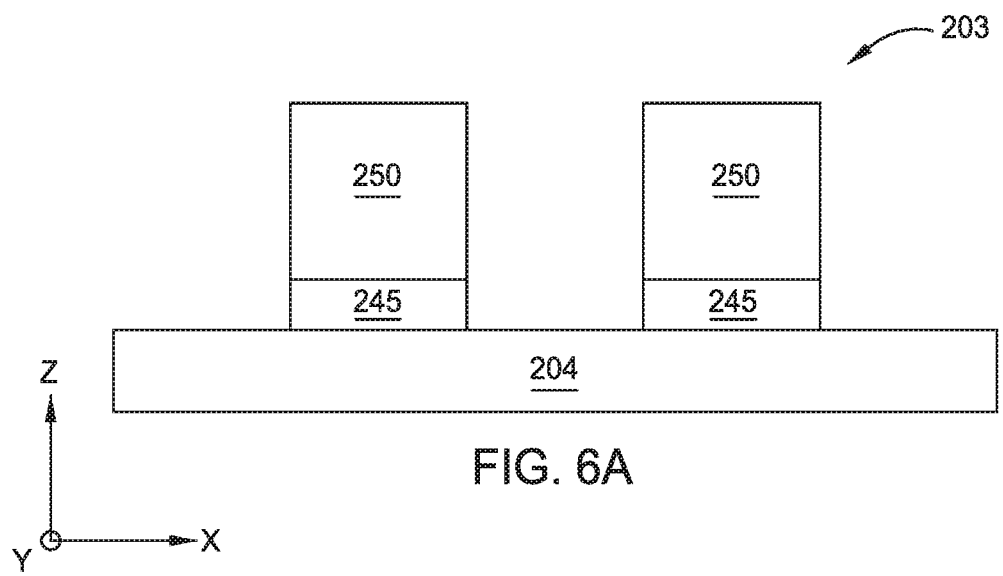
FIG. 6A illustrates a schematic side view of an interconnect stack, according to one embodiment.

FIG. 5 is a flow chart of a method 500 of forming an air gap, according to one embodiment. FIG. 6A illustrates a schematic side view of an interconnect stack, according to one embodiment, which illustrates the structure described by the method 500 of FIG. 5. In some embodiments, the interconnect stack is the third plurality of interconnect layers 203 as described in FIGS. 1B-1N and 2B-2G. As shown, the third plurality of interconnect layers 203 includes a substrate 204, a plurality of metal liners 245, and a plurality of stack metals 250. The plurality of metal liners 245 is disposed over the substrate 204. The plurality of stack metals 250 is disposed over the plurality of metal liners 245. In some embodiments, the substrate 204 is a flat, featureless silicon wafer. In other embodiments, the substrate 204 is a patterned silicon wafer as is typically used in logic gates, I/O gates, field effect transistors, FINFETs, or memory applications. Substrate 204 may include a material such as crystalline silicon (e.g., Si<100> or Si<111>), silicon oxide, strained silicon, silicon germanium, doped or undoped polysilicon, doped or undoped silicon, patterned or non-patterned wafer, silicon on insulator (SOI), carbon-doped silicon oxides, silicon nitride, doped silicon, germanium, gallium arsenide, glass, sapphire, metal layers disposed on silicon, and the like. Substrate 204 may be configured as a 200 mm, 300 mm, or 450 mm diameter wafer, or as a rectangular or square panel. In one embodiment, the substrate 204 contains alignment marks (not shown) or other features on a surface of the substrate 204 to help align and position a desired pattern within the pattern mask 210, to ensure that the correct layer pattern is grown or etched.

The materials used to form parts of the interconnect layers can be deposited via physical vapor deposition (PVD), chemical vapor deposition (CVD), atomic layer deposition (ALD), or other similar process. Use of deposition techniques, such as ALD, alloys layer-by-layer control of the growth of any of the interconnect layers 200. Metal liner 245 is disposed over the substrate 204 and patterned to form discrete regions. In some embodiments, the metal liner 245 includes Ti, Ir, Pt, or an alloy of the above. The stack metal 250 is disposed over the metal liner 245. The metal liner 245 improves the adhesion of the stack metal 250, and reduces grain size of the stack metal. In some embodiments, the stack metal 250 includes a refractory metal, such as Mo, Ru, W, Co, Ni, Cu, Al, Rh, Ir, nickel silicide, or some combination of the above. The components of the third plurality of interconnect layers 203 work in concert to provide the plurality of interconnect layers 200 with all the necessary material layers to perform as a base for the metal containing feature 220, and electrically isolate the stack metal 250 from the substrate 204.

Figure 6B:
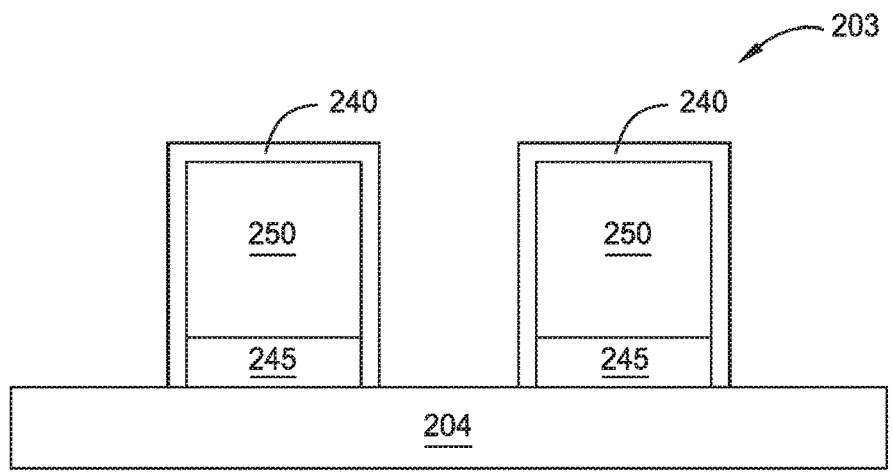
FIG. 6B illustrates a schematic side view of the interconnect stack of FIG. 6A after deposition of a dielectric liner, according to one embodiment.

Referring to FIGS. 5 and 6A-D, a method 500 for forming air gaps in a layered structure is described, according to one or more embodiments of the disclosure provided herein. The method begins at operation 510, where a dielectric liner 240 is deposited (FIG. 6B). The dielectric liner 240 lines the sides of the metal liner 245 and the stack metal 250. In some embodiments, the dielectric liner 240 includes a material such as silicon carbonitride, silicon nitride, or aluminum oxide. The dielectric liner 240 may help to prevent the unwanted migration of metal atoms from the stack metal 250 from migrating into the filler dielectric 230, and causing undesired short circuits between adjacent stack metals. In one embodiment, the substrate 204 is a silicon wafer, the metal liner 245 is titanium that has a thickness of about 15 Å, the stack metal 250 is tungsten that has a thickness of about 300 Å, and the dielectric liner is aluminum oxide with a thickness of 10 Å, which is deposited with a process chemistry of triethylaluminum ($Al(C_2H_5)_3$) and water, the temperature is about 300° C., and the deposition is performed for about 60 seconds.

Figure 6C:
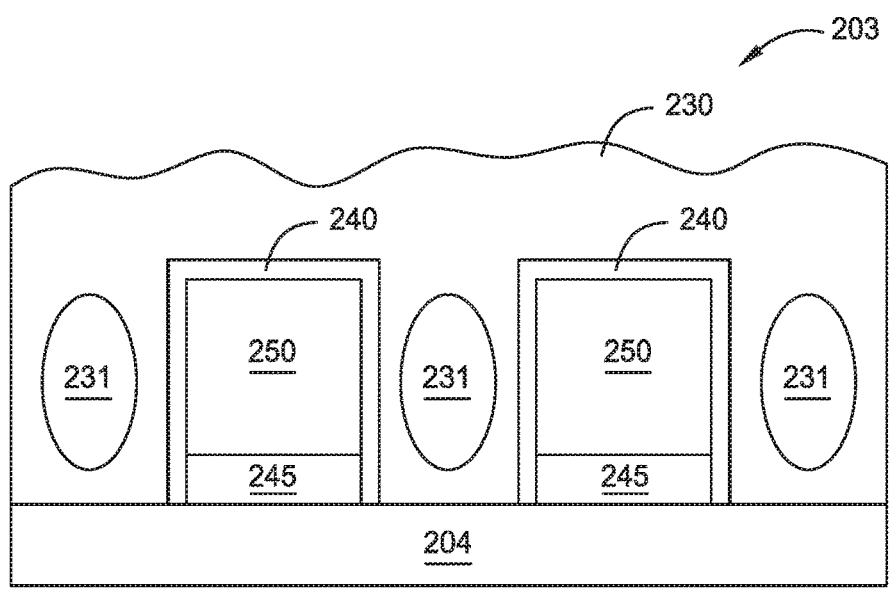
FIG. 6C illustrates a schematic side view of the interconnect stack of FIG. 6B after deposition of a filler dielectric with air gaps, according to one embodiment.

At operation 520, the filler dielectric 230 is deposited (FIG. 6C). In some embodiments, the filler dielectric 230 can be a low k-dielectric. The filler dielectric 230 is silicon dioxide, silicon nitride, or silicon carboxide, according to one embodiment. The filler dielectric 230 has a dielectric constant of about 2.7, according to one embodiment. The filler dielectric 230 can in some cases include a flowable dielectric material, according to one embodiment. The space bounded by the dielectric liner 240, substrate 204, and first plurality of interconnect layers 202 is filled with a filler dielectric 230. The filler dielectric 230 height stops at the height of the stack metal 250, according to one embodiment.

In some embodiments, the filler dielectric 230 does not completely fill the space bounded by the dielectric liner 240 and substrate 204. Instead, an air gap 231 is left in the center portion of the filler dielectric 230, in between adjacent stack metals 250. The air gap 231 is formed by deposition of the filler dielectric 230 in a nonconformal fashion. It is noted that the term "air gap" may also refer any other gas-filled gap and/or to a vacuum containing gap. The air gap 231 reduces the capacitance of the filler dielectric 230. The air gap 231 is of sufficient width such that the adjacent stack metals 250 are electrically isolated, according to one embodiment. The lowered capacitance reduces RC delay and power consumption of the interconnect, and helps prevent unwanted crosstalk between neighboring stack metals 250.

In one embodiment, the filler dielectric 230 includes silicon dioxide, the deposition chemistry used is tris(dimethylamino)silane and hydrogen peroxide, the temperature is about 450° C., and the deposition is performed for about 60 seconds.

Figure 6D:
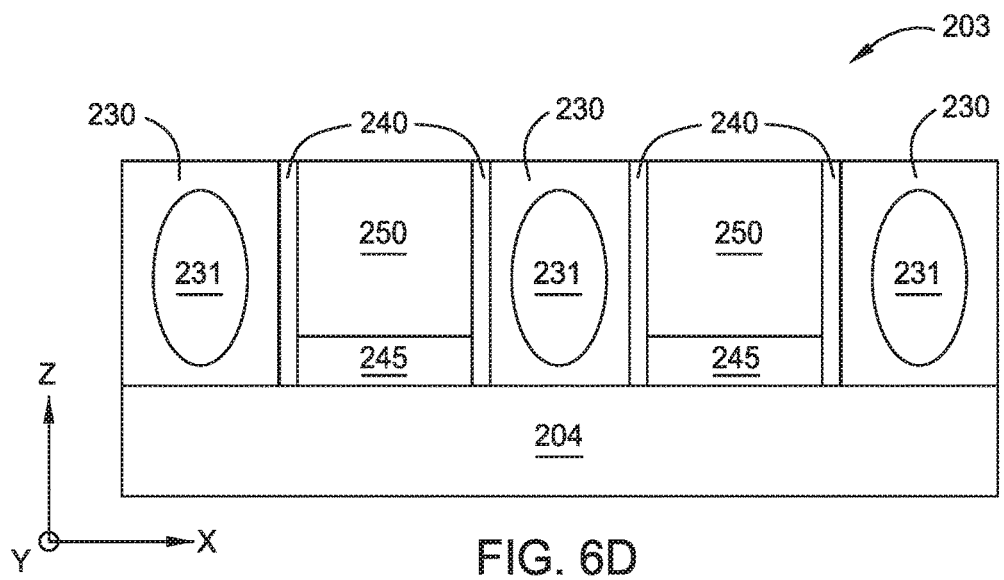
FIG. 6D illustrates a schematic side view of the interconnect stack of FIG. 6C after removal of a portion of the dielectric, according to one embodiment.

At operation 530, the dielectric liner 240 over the stack metal 250 is removed, and excess filler dielectric 230 is removed (FIG. 6D). The excess filler dielectric 230 is removed such that the height of the filler dielectric is about the height of the stack metal 250. A portion of the dielectric liner 240 is removed, according to one embodiment. The entire dielectric liner 240 over the stack metal 250 is removed, according to on embodiment. The dielectric liner 240 and the excess filler dielectric 230 is removed by a chemical mechanical polishing process, according to one embodiment.

As described above, a filler dielectric 230 is added to the plurality of interconnect layers 203, such that an air gap 231 is formed in the filler dielectric. Excess filler dielectric 230 and dielectric liner 240 is removed to maintain a level height with the stack metal 250.

The air gap 231 reduces the capacitance of the filler dielectric 230. The lowered capacitance reduces RC delay and power consumption of the interconnect, and helps prevent unwanted crosstalk between neighboring stack metals 250.

While the foregoing is directed to implementations of the present invention, other and further implementations of the invention may be devised without departing from the basic scope thereof, and the scope thereof is determined by the claims that follow.

The invention claimed is:

1. A method of etching a metal containing feature, comprising: forming openings in a mask to form a patterned mask disposed over a plurality of interconnect layers, wherein the plurality of interconnect layers is disposed over a substrate;
   selectively etching a surface layer followed by a stack metal layer of the plurality of interconnect layers through the openings formed in the patterned mask, thereby exposing a portion of the metal containing feature disposed below the stack metal layer;
   selectively etching less than a total thickness of the portion of the metal containing feature, creating an etched portion of the metal containing feature:
   selectively removing the patterned mask; and
   depositing a dielectric material within the selectively etched portion of the interconnect layers and on the etched portion of the metal containing feature.

2. The method of claim 1, wherein the metal containing feature comprises a metal selected from the group consisting of molybdenum (Mo), ruthenium (Ru), tungsten (W), cobalt (Co), copper (Cu), aluminum (Al), rhodium (Rh), iridium (Ir), and nickel (Ni).

3. The method of claim 1, wherein the plurality of interconnect layers contains an air gap.

4. The method of claim 1, wherein the plurality of interconnect layers further comprises a second metal containing feature, and the metal containing feature and the second metal containing feature are electrically isolated after selectively etching the portion of the metal containing feature.

5. The method of claim 1, wherein the patterned mask is placed by aligning to a feature formed on the substrate.

6. The method of claim 1, wherein the plurality of interconnect layers further comprises a second plurality of interconnect layers, wherein the second plurality of interconnect layers is disposed over the metal containing feature, and the second plurality of interconnect layers is disposed under the patterned mask.

7. The method of claim 1, wherein the plurality of interconnect layers further comprises a third plurality of interconnect layers, wherein the third plurality of interconnect layers is disposed over the substrate, and the third plurality of interconnect layers is disposed under the metal containing feature.

8. The method of claim 1, wherein selectively etching a portion of the plurality of interconnect layers and the selectively etching the portion of the metal containing feature are performed simultaneously.

9. The method of claim 1, further comprising:
depositing a dielectric liner on a plurality of stack metals, wherein the plurality of stack metals are disposed over the substrate;
depositing a filler dielectric over the dielectric liner, such that an air gap is formed in the dielectric filler, the air gap being disposed between adjacent stack metals; and
removing the dielectric filler, such that a height of the dielectric filler is about the height of the stack metals.

10. The method of claim 9, wherein the stack metal comprises a metal or metal containing compound selected from the group consisting of molybdenum (Mo), ruthenium (Ru), tungsten (W), cobalt (Co), nickel silicide (NiSi), copper (Cu), aluminum (Al), rhodium (Rh), iridium (Ir), and nickel (Ni).

11. The method of claim 9, wherein the removing the filler dielectric comprises a chemical mechanical polishing process.

12. The method of claim 9, wherein the filler dielectric comprises Si.

13. The method of claim 9, wherein the air gap is formed such that the adjacent stack metals are electrically isolated.

14. The method of claim 9, wherein a metal liner is disposed under the stack metal and the stack metal is disposed over the substrate.

15. The method of claim 14, wherein the metal liner comprises a metal selected from the group consisting of titanium, iridium, and platinum.

16. A method of etching a metal containing feature, comprising:
forming openings in a mask to form a patterned mask disposed over a plurality of interconnect layers, such that at least a portion of a metal containing feature disposed in the plurality of interconnect layers is under the openings of the patterned mask, wherein the metal containing feature is disposed adjacent to a filler material disposed under a mask portion of the patterned mask, wherein the plurality of interconnect layers are disposed over a surface of a silicon substrate;
selectively etching a portion of the plurality of interconnect layers through the openings formed in the patterned mask to form a channel, wherein a portion of the silicon substrate is exposed within the formed channel;
depositing a dielectric material in the channel; and
selectively removing the patterned mask.

17. The method of claim 16, wherein the metal containing feature consists of molybdenum (Mo), ruthenium (Ru), tungsten (W), cobalt (Co), nickel silicide (NiSi), copper (Cu), aluminum (Al), rhodium (Rh), iridium (Ir), or nickel (Ni).

18. The method of claim 16, wherein the plurality of interconnect layers further comprises a first plurality of interconnect layers, wherein the first plurality of interconnect layers is disposed under the metal containing feature, and the metal containing feature is disposed under the patterned mask.

19. The method of claim 16, wherein the selectively etching a portion of the plurality of interconnect layers comprises:
selectively etching the metal containing feature using a first chemistry; and
selectively etching the plurality of interconnect layers using a second chemistry.

20. The method of claim 16, wherein the plurality of interconnect layers further comprises a second metal containing feature, and the metal containing feature and the second metal containing feature are electrically isolated after the selectively etching the portion of the plurality of interconnect layers.

* * * * *